(12) United States Patent
Matsunaga et al.

(10) Patent No.: US 7,123,314 B2
(45) Date of Patent: Oct. 17, 2006

(54) THIN-FILM TRANSISTOR WITH SET TRAP LEVEL DENSITIES, AND METHOD OF MANUFACTURES

(75) Inventors: Naoki Matsunaga, Tokyo (JP); Kenji Sera, Tokyo (JP)

(73) Assignee: NEC Corporation, Tokyo (JP)

( * ) Notice: Subject to any disclaimer, the term of this patent is extended or adjusted under 35 U.S.C. 154(b) by 37 days.

(21) Appl. No.: 10/871,000

(22) Filed: Jun. 21, 2004

(65) Prior Publication Data
US 2005/0007512 A1   Jan. 13, 2005

(30) Foreign Application Priority Data
Jul. 11, 2003 (JP) ............... 2003-273426

(51) Int. Cl.
*G02F 1/136* (2006.01)
(52) U.S. Cl. ............... 349/43; 349/59; 349/110; 349/111; 257/610
(58) Field of Classification Search ............... 349/43, 349/59, 110–111; 257/59, 72
See application file for complete search history.

(56) References Cited

U.S. PATENT DOCUMENTS

| | | | | |
|---|---|---|---|---|
| 5,821,559 A | * | 10/1998 | Yamazaki et al. | 257/57 |
| 5,950,077 A | * | 9/1999 | Ohue et al. | 438/149 |
| 6,066,860 A | * | 5/2000 | Katayama et al. | 257/71 |
| 6,583,830 B1 | * | 6/2003 | Yasukawa et al. | 349/43 |
| 6,768,522 B1 | * | 7/2004 | Yasukawa et al. | 349/43 |
| 2003/0210363 A1 | * | 11/2003 | Yasukawa et al. | 349/110 |
| 2004/0206265 A1 | * | 10/2004 | Bell | 102/347 |

FOREIGN PATENT DOCUMENTS

| | | |
|---|---|---|
| JP | 3-42123 | 4/1991 |
| JP | 9-8259 | 1/1997 |
| JP | 9-219528 | 8/1997 |
| JP | 2001-326360 | 11/2001 |
| JP | 2002-108248 | 4/2002 |
| JP | 2002-203968 | 7/2002 |
| JP | 2003-131261 | 5/2003 |

* cited by examiner

*Primary Examiner*—Andrew Schechter
*Assistant Examiner*—Phu Vu
(74) *Attorney, Agent, or Firm*—Young & Thompson

(57) ABSTRACT

A light shielding film capable of shielding against light entering an active layer of a TFT and electroconductive is formed on the lower layer side of the active layer. Electrical stress is applied by causing a current in an insulating film between source and drain electrodes and the light shielding film to introduce a trap level at a density at least about $5 \times 10^{12}/cm^2$ into a source region and a drain region in a surface portion of the active layer on the light shielding film side.

19 Claims, 25 Drawing Sheets

THIN-FILM TRANSISTOR WITH SET TRAP LEVEL DENSITIES, AND METHOD OF MANUFACTURES

CROSS-REFERENCE TO RELATED APPLICATIONS

The disclosure of Japanese Patent Application No. JP2003-273426 filed on Jul. 11, 2003 including the specification, drawings and abstract is incorporated herein by reference in its entirety.

BACKGROUND OF THE INVENTION

1. Field of the Invention

The present invention relates to a thin-film transistor and a method of manufacturing the thin-film transistor. More particularly, the present invention relates to a thin-film transistor having an electroconductive film opposed to (i.e., facing) an active layer and a method of manufacturing the thin-film transistor. The present invention also relates to a TFT substrate and a liquid crystal display device. Further particularly, the present invention relates to a TFT substrate having a plurality of thin-film transistors of the present invention and to a liquid crystal display device having such a TFT substrate.

2. Description of Related Art

In recent years, the development of display apparatuses using liquid crystal display devices is being pursued as a display apparatus for OA apparatus. Among various liquid crystal display devices, active-matrix liquid crystal display devices using as a switching device a thin-film transistor (TFT) which is an active element are advantageous in that reductions in contrast and response speed are limited even in a case where the number of scanning lines is large. For this reason, active-matrix liquid crystal display devices are ordinarily used in high-quality display apparatuses for OA apparatus and in high-definition TV displays. Also, an active-matrix liquid crystal display device used as a light valve in a projection-type display apparatus such as a projector has the advantage of easily producing a large-screen display.

In a case where a liquid crystal display device is used as a light valve in a projection-type display apparatus, it is placed between a light source and an optical system through which light from the light source is projected onto a screen or the like. In this placement, the liquid crystal display device is placed so that the light source is on the counter substrate side of the liquid crystal display device, while the optical system is on the thin-film semiconductor device array substrate (TFT substrate) side. The liquid crystal display device controls, on the basis of screen information, the intensity of light transmitted to the optical system side in light entering from the light source at a comparatively high luminance. More specifically, the liquid crystal display device drives TFTs in a switching manner to control the electric field applied to the liquid crystal layer corresponding to each display element, thereby changing the transmittance of each display element to adjust the intensity of light passing therethrough. After light has passed through the liquid crystal display device, it is projected in an enlargement projection manner through the projection optical system constituted by a lens.

In active-matrix liquid crystal display devices, a layer of a semiconductor such as amorphous silicon or polycrystalline silicon is used as a TFT active layer. When light enters this active layer, a light leak current is generated due to photoexciation to cause a reduction in contrast for example, resulting in deterioration in display performance. In particular, in a case where an active-matrix liquid crystal display device is used as a light valve in a projection-type display apparatus, light enters the liquid crystal display device at a high luminance and the influence of a generated light leak current is large. In this case, not only light from the light source but also light reflected by the projection optical system enters the active layer of the TFT in the liquid crystal display device. Therefore the influence of light leak current is further increased. In recent years, the development of projection-type display apparatuses reduced in size and improved in luminance has been advanced and the luminance of light incident on a liquid crystal display device used as a light valve tends to increase. For this reason, the light leak current problem has become more serious.

As a technique for reducing light leaks, a technique disclosed in Japanese Patent Laid-Open No. 2003-131261 (patent document 1) is known. In this technique, a first light shielding film having a light shielding property is placed at such a position as to face a gate electrode with the active layer interposed therebetween and a second light shielding film having a light absorbing property is placed between the first light shielding film and the active layer to reduce light entering the active layer. In the technique described in patent document 1, the light shielding effect is increased if the distance between the light shielding film and the active layer is reduced. Effective shielding of the active layer from light is thereby achieved, thus effectively reducing a light leak current. However, if the light shielding film is brought close to the active layer, a problem arises that the light shielding film electrically influences the active layer so that a channel is formed in the active layer on the light shielding film side to cause another leak current on the back channel side of the TFT.

As a technique for solving the above-described problem, a technique described in Japanese Utility Model Laid-Open No. 3-042123 (patent document2) is known. In this technique, an insulating film such as a tantalum oxide having a high interfacial level is placed between the active layer and a light shielding film to reduce the electrical influence of the light shielding film on the active layer, thereby inhibiting the formation of a channel on the back channel side of the TFT. In this arrangement, the distance between the active layer and the light shielding film is reduced to reduce a light leak current while preventing a leak current due to the electrical influence of the light shielding film.

In the technique described in patent document 2, an insulating film of a high interfacial level is placed between the active layer and the light shielding film to inhibit the formation of a channel on the front channel side of the TFT. However, if this arrangement is adopted, the channel cannot be easily formed on the back channel side of the TFT even when a potential for turning on the TFT is applied to the gate electrode. There is, therefore, a problem that the drain current when the TFT is on is also reduced, while the leak current is reduced.

In the technique described in patent document 2, there is a need to place a special insulating film as the high-interfacial-level insulating film between the active layer and the light shielding film, which insulating film is different from the insulating film used in conventional TFTs. For manufacture of such a TFT, it is required that a manufacturing process different from a conventional TFT manufacturing process. As a result, the manufacturing process is complicated and the TFT manufacture throughput is reduced.

An object of the present invention is to provide a thin-film transistor which is designed to solve the above-described problems and in which the reduction in the drain current when the TFT is on can be limited while a leak current due to a light shielding film is reduced. Another object of the present invention is to provide a method of manufacturing a thin-film transistor which enables the thin-film transistor of the present invention to be manufactured without requiring a complicated manufacturing process.

SUMMARY OF THE INVENTION

According to at least of a example of the present invention, a thin-film transistor comprises an electroconductive film; a first insulating film located on the electroconductive film; an active layer located on the first insulating film, the active layer having a source region, a drain region, and a channel region intermediate the source region and the drain region, the active layer including an interface region adjacent the first insulating film; a gate insulating film located on the active layer; and a gate electrode located on the gate insulating film, wherein, a first trap level density of the source and drain regions in the interface region, is higher than a second trap level density of the channel region in the interface region.

In the thin-film transistor of the present invention, the trap level density in surface portions of the source region and the drain region on the electroconductive film side in the active layer is set higher than the trap level density in a surface portion of the channel region on the electroconductive film side. Therefore, the electrical influence of the electroconductive film on the source region and the drain region is smaller than the electrical influence of the electroconductive film on the channel region.

In a case where an insulating film of a high interfacial level is placed between the electroconductive film and the active layer to reduce the electrical influence of the electroconductive film on the active layer according to a conventional art, a leak current due to the electrical influence of the electroconductive film is reduced but the facility with which a channel is formed on the electroconductive film side of the channel region is simultaneously reduced, resulting in a reduction in drain current when the thin-film transistor is on. In the thin-film transistor of the present invention, the trap level density in the channel region in the surface portion of the active layer on the electroconductive film side is set equal to the trap level density in the surface of the active layer on the gate electrode side for example, and the trap level density in the source region and the drain region is set higher than the trap level density in the channel region in the surface portion of the active layer on the electroconductive film side, thereby reducing the leak current due to the electrical influence of the electroconductive film even in a case where the active layer and the electroconductive film are brought closer to each other, while avoiding a reduction in drain current when the thin-film transistor is on. The electroconductive film may be formed of a non-optically-transparent metal silicide, for example. Alternatively, the electroconductive film may be formed of silicon having a light absorbing property and doped with a carrier.

It is preferred that in the thin-film transistor of the present invention the trap level density in the source region and the drain region in the surface portion of the active layer opposed to the electroconductive film be at least about $5 \times 10^{12}/cm^2$. In this case, the electrical influence of the electroconductive film on the active layer can be effectively reduced, and light entering the active layer can be effectively reduced by setting the distance between the electroconductive film and the active layer, for example, to 400 nm or less, preferably 100 to 250 nm.

For the thin-film transistor of the present invention, an arrangement may be adopted in which the electroconductive film includes a light-absorbing film opposed to the active layer with the first insulating film interposed therebetween, and a light-reflecting film opposed to the light-absorbing film with a second insulating film interposed therebetween. In this case, light entering the channel region of the active layer can be effectively reduced by the light-absorbing film and the light-reflecting film.

For the thin-film transistor of the present invention, an arrangement may be adopted in which the electroconductive film is a light-reflecting film, and a light-absorbing film is further provided which is placed adjacent to the surface of the light-reflecting film opposed to the active layer. In this case, as well as in the above-described case, light entering the channel region of the active layer can be particularly effectively reduced by the light-absorbing film and the light-reflecting film. The light-absorbing film may be formed of an electroconductive film or a semiconductor film using an intrinsic semiconductor.

It is preferred that in the thin-film transistor of the present invention the active layer have a low-concentration carrier region between the source region and the channel region and between the drain region and the channel region, the low-concentration carrier region being of the same conduction type as the source region and the drain region and having an impurity concentration lower than that in the source region and the drain region. In this case, the trap level density in the surface of the low-concentration carrier region on the electroconductive film side can be set substantially equal to the trap level density in the surfaces of the source region and the drain region on the electroconductive film side.

According to another example of the present invention, a TFT substrate comprises an optically transparent substrate; a plurality of the thin-film transistors, with the electroconductive film of each of said transistors formed on the optically transparent substrate; and a display element electrode connected to each of said thin-film transistors.

In the TFT substrate of the present invention, the thin-film transistor is formed so that the electroconductive film is on the optically transparent substrate side. Since in the thin-film transistor of the present invention the leak current due to the electrical influence of the electroconductive film can be reduced even in a case where the electroconductive film is brought closer to the active layer, the TFT substrate having such a thin-film transistor can be suitably used in a liquid crystal display device into which light enters at a comparatively high luminance from the optically transparent side. Also, since a reduction in drain current when the thin-film transistor is on can be avoided, the speed of writing of a signal to display element electrode is not reduced.

According to further example of the present invention, a liquid crystal display device comprises the TFT substrate; a counter substrate opposed to said TFT substrate; and a liquid crystal layer between said TFT substrate and said counter substrate.

In the liquid crystal display device of the present invention, backlight enters from the counter substrate side, and the amount of backlight passing through the liquid crystal layer is controlled by means of the display element electrode on the TFT substrate and a counter electrode on the counter substrate. Each thin-film transistor formed on the TFT substrate can be designed to reduce the light leak by bringing the electroconductive film closer to the active layer while limiting the reduction in drain current during the on state, and also to reduce the leak current due to the electrical influence of the electroconductive film. In the liquid crystal display device of the present invention having the TFT substrate on which this thin-film transistor is formed, therefore, a high luminance and high contrast can be attained.

A thin-film transistor manufacturing method in a first aspect of the present invention is a method of manufacturing a thin-film transistor having an active layer, a gate insulating film and a gate electrode successively formed on at least one layer of an electroconductive film with a first insulating film interposed therebetween, the method being characterized by including causing a current of a value equal to or larger than a predetermined value to flow in the insulating film between the active layer and the electroconductive film to introduce a trap level into a surface portion of the active layer opposed to the electroconductive film.

In the thin-film transistor manufacturing method in the first aspect of the present invention, a predetermined potential is applied to the source electrode, the drain electrode and the electroconductive film, for example, after the formation of the thin-film transistor, and this state is maintained for a predetermined time period to cause a current to flow at a current density at least a certain level in the insulating film between the electroconductive film and the active layer of the thin-film transistor, thereby introducing a trap level into a region in the insulating film immediately below the source and drain regions and into regions in the interface between the insulating film and the active layer immediately below the source and the drain. In this case, the trap level can be introduced at the desired density into the desired regions in the surface portion of the active layer on the electroconductive film side by setting the voltages applied to the electrodes to suitable values. Thus, the step of introducing a trap level into the surface portion of the active layer on the electroconductive film side can be arranged as a simple step to manufacture the thin-film transistor without reducing the throughput.

A thin-film transistor manufacturing method in a second aspect of the present invention is a method of manufacturing a thin-film transistor having an active layer, a gate insulating film and a gate electrode successively formed on at least one layer of an electroconductive film with a first insulating film interposed therebetween, the method being characterized by including doping a surface portion of the first insulating film opposed to the active layer with impurity ions to introduce a trap level into the interface between the active layer and the first insulating film.

In the thin-film transistor manufacturing method in the second aspect of the present invention, the surface portion of the first insulating film on the active layer side is doped with impurity ions to introduce a trap level into the interface between the first insulating film and the active layer, i.e., a surface portion of active layer on the electroconductive film side. In this case, the trap level can be introduced at the desired density into the desired regions in the surface portion of the first insulating film on the active layer side, for example, by suitably setting a photoresist pattern to be formed on the first insulating film. Thus, the step of introducing a trap level into the surface portion of the active layer on the electroconductive film side can be arranged as a simple step to manufacture the thin-film transistor without reducing the throughput, as in the above-described case.

A thin-film transistor manufacturing method in a third aspect of the present invention is a method of manufacturing a thin-film transistor having an active layer, a gate insulating film and a gate electrode successively formed on at least one layer of an electroconductive film with a first insulating film interposed therebetween, the method being characterized by including doping a surface portion of the active layer opposed to the electroconductive film with impurity ions to introduce a trap level into a surface portion of the active layer opposed to the electroconductive film.

In the thin-film transistor manufacturing method in the third aspect of the present invention, doping with impurity ions is effected from the active layer upper layer by using a predetermined acceleration voltage, for example, at the time of formation of a source region and a drain region in the active layer, thereby introducing a trap level into the surface portion of the active layer on the electroconductive film side. In this case, the trap level can be introduced at the desired density into the desired region in the surface portion of the active layer on the electroconductive film side by suitably setting a photoresist pattern to be formed on the active layer. When this thin-film transistor manufacturing method is used, a trap level can be introduced into a surface portion of the active layer on electroconductive film side without adding any new process step. Therefore, the thin-film transistor can be manufactured without reducing the throughput, as in the above-described case.

A thin-film transistor manufacturing method in a fourth aspect of the present invention is a method of manufacturing a thin-film transistor having an active layer, a gate insulating film and a gate electrode successively formed on at least one layer of an electroconductive film with a first insulating film interposed therebetween, the method being characterized by including performing a plasma treatment on a surface portion of the first insulating film opposed to the active layer to introduce a trap level into the interface between the active layer and the first insulating film.

In the thin-film transistor manufacturing method in the fourth aspect of the present invention, the surface portion of the first insulating film on the active layer side is damaged, for example, by a hydrogen plasma treatment to introduce a trap level into the interface between the first insulating film and the active layer. In this case, the trap level can be introduced at the desired density into the desired region in the surface portion of the first insulating film on the active layer side by suitably setting the planar configuration of a protective insulating film to be formed on the first insulating film. Thus, the step of introducing a trap level into a surface portion of the active layer on the electroconductive film side can be arranged as a simple step to manufacture the thin-film transistor without reducing the throughput, as in the above-described case.

In the thin-film transistor manufacturing methods in the first to fourth aspects of the present invention, it is preferable to introduce a trap level in such a manner that the trap level density in the source region and the drain region is higher than the trap level density in the channel region in the surface portion of the active layer opposed to the electroconductive film. In this case, a thin-film transistor can be obtained which can be designed to reduce the light leak by bringing the electroconductive film closer to the active layer while limiting the reduction in drain current during the on state, and also to reduce the leak current due to the electrical influence of the electroconductive film.

In the thin-film transistor of the present invention, the trap level density in surface portions of the source region and the drain region on the electroconductive film side in the active layer is set higher than the trap level density in a surface portion of the channel region on the electroconductive film side. Therefore, the electrical influence of the electroconductive film on the source region and the drain region is smaller than the electrical influence of the electroconductive film on the channel region. For this reason, the leak current due to the electroconductive film can be reduced and a reduction in drain current when the thin-film transistor is on can be avoided even in a case where the electroconductive film is brought closer to the active layer. According to the thin-film transistor manufacturing method of the present invention, the thin-film transistor of the present invention can be manufactured without adding any complicated step.

Since the TFT substrate of the present invention has the thin-film transistor of the present invention, it can be suitably used in a liquid crystal display device into which light enters at a comparatively high luminance from the counter substrate side. In the liquid crystal display device of the present invention, a high luminance and high contrast can be attained since the TFT substrate of the present invention is provided.

DETAILED DESCRIPTION OF PREFERRED EMBODIMENTS

The present invention will be described further in detail with respect to embodiments thereof with reference to the drawings.

(First Embodiment)

Figure 1:
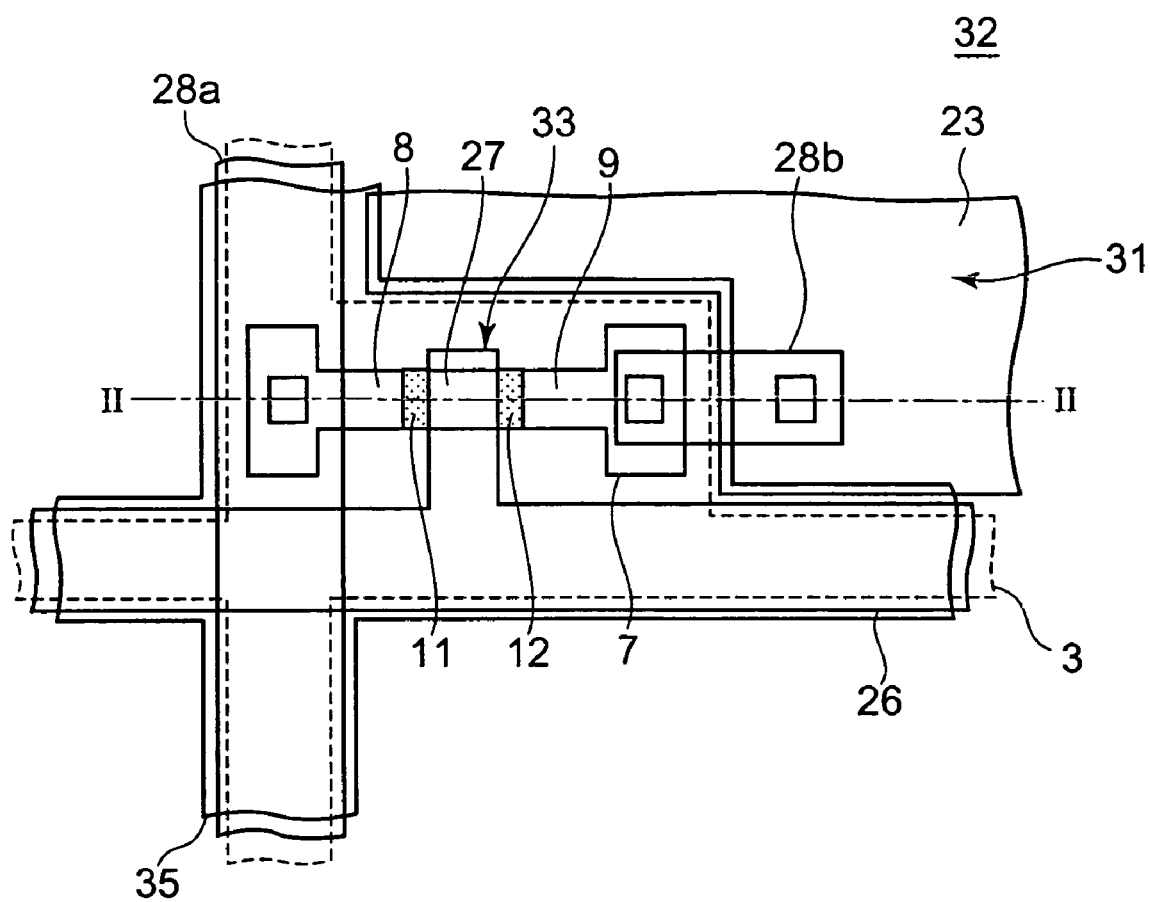
FIG. 1 is a plan view of a portion of a thin-film transistor array substrate about a thin-film transistor in a first embodiment of the present invention.
Figure 2:
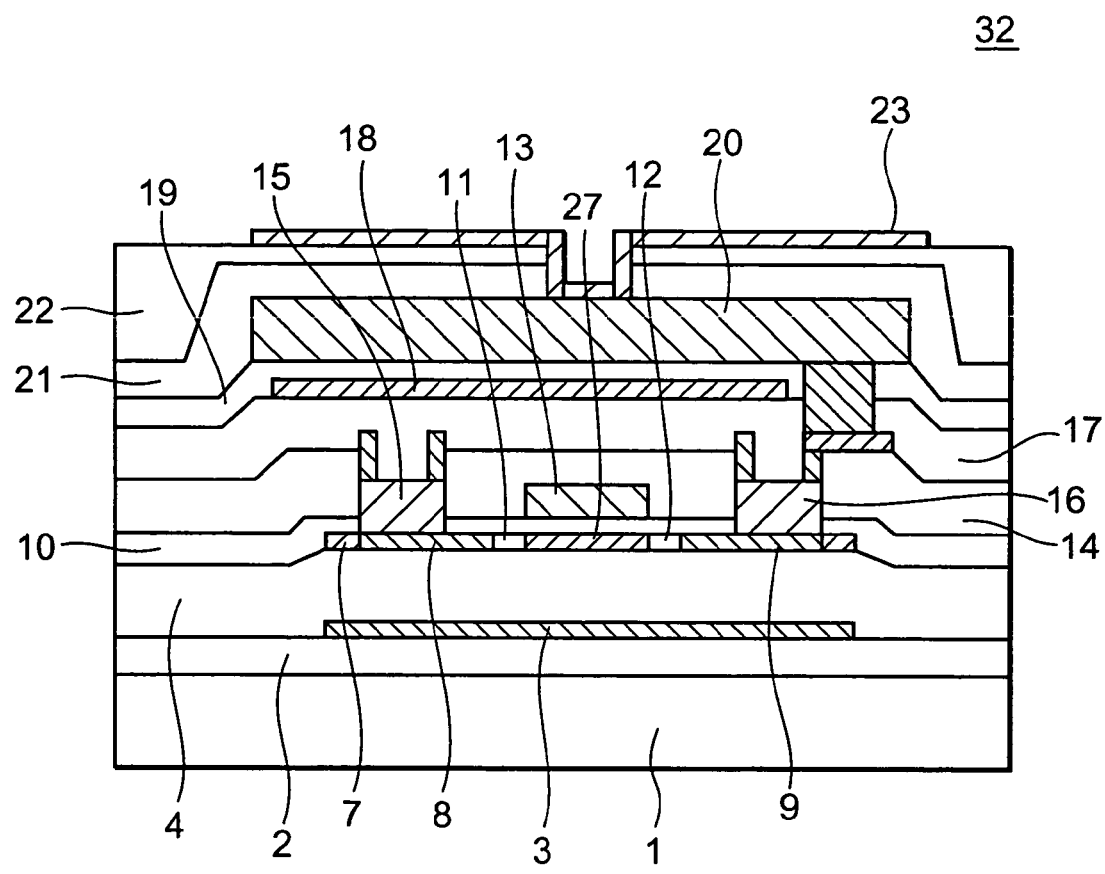
FIG. 2 is a cross-sectional view taken along II—II of FIG. 1.

FIG. 1 shows a plan view of a portion of a thin-film transistor array substrate (TFT substrate) about a TFT in a liquid crystal display device in a first embodiment of the present invention, and FIG. 2 is a cross-sectional view taken along II—II of FIG. 1. The structure of the TFT substrate 32 constituting the active-matrix liquid crystal display device will be described in detail with reference to FIGS. 1 and 2. FIGS. 1 and 2 show one of a plurality of TFTs included in the TFT substrate 32. A black matrix 35 shown in FIG. 1 is omitted in FIG. 2.

As shown in FIG. 1, on the TFT substrate 32 are formed a plurality of data lines 28a extending along a Y-direction, a plurality of gate lines 26 extending along an X-direction, a plurality of TFTs 33 arranged in matrix form, and a black matrix 35 which shields the gate lines 26, the data lines 28a and the TFTs 33. The gate lines 26 are formed of a polysilicon film, a silicide film or the like doped with a carrier, and the data lines 28a are formed of an aluminum film or the like. The TFTs 33 are formed in the vicinity of points of intersection of the data lines 28a and the gate lines 26.

The black matrix 35 is formed of a metal having the property of shielding light. The black matrix 35 is formed at positions such as to be spatially superposed on the gate lines 26, the data lines 28a and the TFTs 33. Each of the display element regions 31 of the liquid crystal display device is defined in a generally rectangular form by the gate lines 26 and the data lines 28a, in other words by the black matrix 35. In the display element region 31, a display element electrode 23 formed of a transparent electrode is formed. The display element electrode 23 is connected to the drain of the TFT 33 via a through hole.

As shown in FIG. 2, the TFT substrate 32 has a glass substrate 1, a base insulating film 2, a light shielding film 3, an insulating film 4 and an active layer 7, the films and layers being successively formed on the glass substrate 1. On the upper layer side of the active layer 7 are formed a gate insulating film 10, a gate electrode 13, a first interlayer insulating film 14, a source electrode 15, a drain electrode 16, a second interlayer insulating film 17, a lower electrode 18, a capacitor insulating film 19, an upper electrode 20, a third interlayer insulating film 21, a flattening film 22, and the display element electrode 23.

The base insulating film 2 is made of silicon oxide and is formed on the entire surface of the glass substrate 1 made of high-strain-point glass. The light shielding film 3 is formed of a metal or metal silicide film having electroconductive and non-light-transmitting properties to shield against the light entering from the glass substrate 1 side. The light shielding film 3 is formed in such a region as to be superposed on the active layer 7 along the X-direction in the lower layer side of the region corresponding to the TFT 33, or in a region slightly larger in area than the active layer 7.

The insulating film 4 is made of silicon oxide and is formed between the light shielding film 3 and the active layer 7. The active layer 7 forms an active layer of the TFT 33 and is opposed to the light shielding film 3 with the insulating film 4 interposed therebetween. The trap level density in the region corresponding to a source region 8 and a drain region 9 in a surface portion of the active layer 7 on the side opposed to the light shielding film 3, which surface portion is the interface between the active layer 7 and the insulating film 4, is set to at least about $5 \times 10^{12}/cm^2$.

As shown in FIG. 1, the active layer 7 is formed so as to be larger in width in the Y-direction at opposite ends in the X-direction than at its center. The source region 8 in which the carrier density is set higher is formed in the vicinity of one end of the active layer 7 in the X-direction, and the drain region 9 in which the carrier density is set higher is formed in the vicinity of the other end of the active layer 7 in the X-direction. The source region 8 is connected to the first data line 28a by the source electrode 15 made of aluminum silicon. The drain region 9 is connected to the second data line 28b by the drain electrode 16 made of aluminum silicon.

Referring back to FIG. 2, the gate insulating film 10 made of silicon oxide is formed on the active layer 7, and the gate electrode 13 made of a metal or a metal silicide is formed on the gate insulating film 10 in the vicinity of the center of the active layer 7 in the X-direction. A channel region 27 is formed at such a position as to be spatially superposed on the gate electrode 13. A low-concentration carrier region 11 is formed between the source region 8 and the channel region 27 immediately below the gate electrode 13, and a low-concentration carrier region 12 is formed between the drain region 9 and the channel region 27. The first interlayer insulating film 14 made of silicon oxide is formed on the gate insulating film 10 and the gate electrode 13.

The second interlayer insulating film 17 made of silicon nitride is formed on the first interlayer insulating film 14, the source electrode 15 and the drain electrode 16, and the lower electrode 18 is formed on the second interlayer insulating film 17. The capacitor insulating film 19 made of silicon nitride is formed on the lower electrode 18, and the upper electrode 20 is formed on the capacitor insulating film 19. The upper electrode 20 is connected to the drain electrode 16 via the second data line 28b (FIG. 1). The upper electrode 20 and the lower electrode 18 are opposed to each other with the capacitor insulating film 19 interposed therebetween. The upper electrode 20 and the lower electrode 18 constitute a display element capacitor. The third interlayer insulating film 21 made of silicon nitride is formed on the upper electrode 20.

The flattening film 22 is formed on the third interlayer insulating film 21. The display element electrode 23 is formed on the flattening film 22. The display element electrode 23 is connected to the upper electrode 20 via a contact hole. The display element electrode 23 is made of ITO and is constructed as a transparent electrode formed in the display element region 31 (FIG. 1). In the liquid crystal display device, the electric field applied to a liquid crystal not shown is controlled by changing the potential applied to the display element electrode 23, thereby controlling the amount of light transmitted from the counter substrate side (light source side).

FIGS. 3(a) to 3(h) respectively show the TFT substrate 32 in fabrication steps. In manufacture of the TFT substrate 32, the base insulating film 2 is first formed to a film thickness of about 300 nm on the entire surface of the glass substrate 1 made of high-strain-point glass or the like by a CVD method, and the light shielding film 3 which is a metal film or a metal silicide film having non-light-transmitting and electroconductive properties is formed to a film thickness of 100 to 200 nm on the base insulating film 2 by a sputtering method (FIG. 3(a)). Next, a photoresist mask is formed by a photolithography method in correspondence with the region in which the active layer 7 is formed or a region slightly larger than the region in which the active layer 7 is formed, and the light shielding film 3 is selectively removed by a dry etching method (FIG. 3(b)).

The insulating film 4 is formed to a film thickness of 400 nm or less by a CVD method using gas of a mixture of TEOS and oxygen. A silicon film is formed to a film thickness of 50 to 150 nm on the insulating film 4 and is annealed by excimer laser to be crystallized. A photoresist mask is formed on the silicon film by a photolithography method, and patterning is performed on the silicon film by using this mask, thereby forming the active layer 7 having the planar shape shown in FIG. 1 (FIG. 3(c)).

On the active layer 7 after patterning, a photoresist mask is formed by a photolithography method so that the regions where the source region 8 and the drain region 9 will be formed are exposed. A carrier is then implanted in the active layer 7 by using an ion doping method or an ion implantation method so that the carrier concentration is about $5 \times 10^{20}/cm^3$, thereby forming the source region 8 and the drain region 9. After the formation of the source region 8 and the drain region 9, the gate insulating film 10 is formed to a film thickness of about 50 to 150 nm by a CVD method (FIG. 3(d)).

Subsequently, the gate electrode 13 is formed and the carrier is implanted at a low concentration in the active layer 7 by using an ion doping method or an ion implantation method, this gate electrode and a photoresist mask separately formed being used as a mask. The low-concentration carrier regions 11 and 12 are thereby formed (FIG. 3(e)). The carrier concentration in the low-concentration carrier regions 11 and 12 is set to about $10^{17}/cm^3$. Thereafter, the implanted carrier is activated by a CVD apparatus to be hydrogenated.

Subsequently, the first interlayer insulating film 14, the source electrode 15 and the drain electrode 16 are formed in the same manner as in the TFT substrate manufacturing method for forming conventional liquid crystal display devices. When the source electrode 15 and the drain electrode 16 are formed, the light shielding film 3 is electrically connected to a peripheral circuit not shown, which is formed outside the display element region on the TFT substrate 32. The second interlayer insulating film 17 is thereafter formed (FIG. 3(f)).

A metal film is formed to a film thickness of about 200 to 300 nm by a sputtering method, a photoresist mask is formed on the metal film by a photolithography method, and patterning is performed on the metal film by a dry etching method, thereby forming the lower electrode 18. Subsequently, the capacitor insulating film 19 is formed to a film thickness of about 100 to 200 nm by a CVD method and patterning is performed on the capacitor insulating film 19 to form the contact hole for connection between the upper electrode 20 and the drain electrode 16. Thereafter, an aluminum silicon film is formed to a film thickness of about 500 to 700 nm, a photoresist mask is formed on the aluminum silicon film by a photolithography method, and patterning is performed on the aluminum silicon film by a dry etching method, thereby forming the upper electrode 20 (FIG. 3(g)).

The third interlayer insulating film 21 is formed to a film thickness of about 300 to 600 nm by a CVD method and the flattening film 22 is formed on the third interlayer insulating film 21. The contact hole for connecting the display element electrode 23 to the upper electrode 20 of the display element capacitor is formed in the flattening film 22 and the display element electrode 23 is thereafter formed to a thickness of about 30 to 100 nm by using a sputtering method (FIG. 3(h)). The TFT substrate 32 having a sectional structure shown in FIG. 2 is obtained by the above-described fabrication process.

After the formation of the TFT substrate 32, a trap level is introduced into the surface of the active layer 7 on the light shielding film 3 side. At the time of introduction of this trap level, the gate electrode 13, the source electrode 15 and the drain electrode 16 are maintained at ground potential and a constant potential of −20 to −80 V is applied to the light shielding film 3 to cause a current to flow at a current density of about at least about 2.5 A/m$^2$ in the insulating film 4 between the source electrode 15 and the light shielding film 3 and between the drain electrode 16 and the light shielding film 3. This state is maintained for 1 to 10 minutes. By such electrical stress, the crystallinity of the insulating film 4 is deteriorated to cause a crystal defect. A trap level is thereby introduced into the source region 8, the drain region 9, the low-concentration carrier regions 11 and 12 in the surface portion of the active layer 7 on the light shielding film 3 side and into the insulating film 4.

Figure 4:
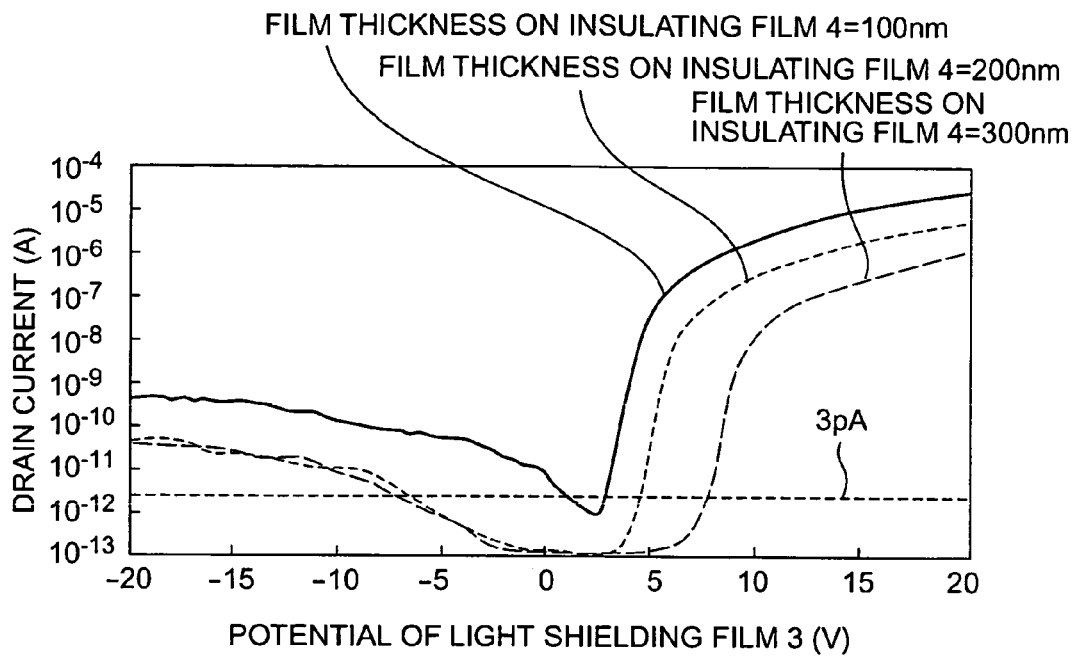
FIG. 4 is a graph showing the relationship between the potential on the light shielding film 3 and the drain current in a TFT in which no trap level is introduced into a surface portion of the active layer opposed to the light shielding film.

FIG. 4 shows the relationship between the potential on the light shielding film 3 and the drain current in a conventional TFT in which no trap level is introduced into the surface of the active layer 7 on the light shielding film 3 side. The graph shown in FIG. 4 indicates a drain current characteristic, i.e., a leak current characteristic depending on the light shielding film 3, when a potential for turning off the TFT is applied to the gate electrode 13 to enable observation of black in the liquid crystal display device. It is assumed with respect to the following description that when the drain current is equal to or larger than 3 pA, a display element on which black is to be displayed in the liquid crystal display device is not observed as black on human vision but observed as a reduction in contrast or a bright point on the display device. In other words, it is assumed that when the drain current is equal to or larger than 3 pA, a degradation in display quality of the liquid crystal display device such as a reduction in contrast or appearance of a bright point due to a leak current is observed.

In general, if the distance between the active layer 7 and the light shielding film 3 is reduced, the electrical influence of the light shielding film 3 on the active layer 7 is liable to increase. As shown in FIG. 4, in a TFT in which no trap level is introduced into the surface of the active layer 7 on the light shielding film 3 side, substantially no range of potential applied to the light shielding film 3 is exhibited in which the drain current is smaller than 3 pA and the display quality of the liquid crystal display device is reduced by a leak current when the film thickness of the insulating film 4, i.e., the distance between the active layer 7 and the light shielding film 3 is 100 nm. As the film thickness of the insulating film 4 is increased to 200 nm and to 300 nm, the leak current due to the potential applied to the light shielding film 3 is reduced and the range of potential applied to the light shielding film 3 in which the drain current is smaller than 3 pA is increased. The reduction in display quality of the liquid crystal display device due to the leak current is thereby limited. In this case, however, a problem arises that light not blocked by shielding with the light shielding film 3 when a backlight source is lighted enters the active layer 7 to cause a light leak current and the display quality of the liquid crystal display device is reduced under the influence of the light leak current.

Figure 5:
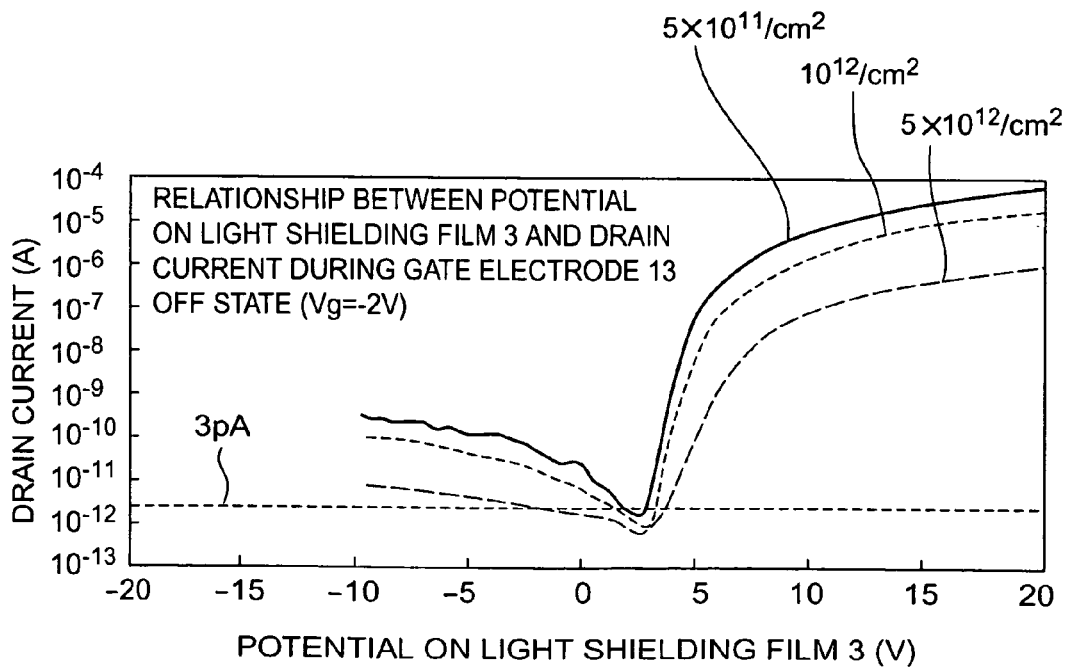
FIG. 5 is a graph showing the relationship between the potential on the light shielding film 3 and the drain current in a TFT in which a trap level is introduced into a surface portion of the active layer opposed to the light shielding film.

FIG. 5 shows the relationship between the potential on the light shielding film 3 and the drain current in a TFT in which a trap level is introduced into the regions in a surface portion of the active layer 7 on the light shielding film 3 side corresponding to the source region 8 and the drain region 9. The graph shown in FIG. 5 indicates a leak current (drain current) characteristic depending on the potential on the light shielding film 3, when the insulating film 4 is formed to a film thickness of 100 nm and a potential for turning off the TFT is applied to the gate electrode 13 as in the case of the characteristic measurement shown in FIG. 4. As shown in FIG. 5, substantially no range of potential applied to the light shielding film 3 is exhibited in which the drain current is smaller than 3 pA when the trap level density introduced into the regions in the surface portion of the active layer 7 on the light shielding film 3 side corresponding to the source region 8 and the drain region 9 is $5 \times 10^{11}/cm^2$ and when the trap level density is $1 \times 10^{12}/cm^2$.

In the TFT, if the introduced trap level density is higher, the range of potential applied to the light shielding film 3 in which the drain current is equal to or smaller than 3 pA tends to increase. As shown in FIG. 5, when the trap level density introduced into the regions in the surface portion of the active layer 7 on the light shielding film 3 side corresponding to the source region 8 and the drain region 9 is $5 \times 10^{12}/cm^2$, the range of potential applied to the light shielding film 3 in which the drain current is smaller than 3 pA is increased in comparison with the case where the introduced trap density is lower. From this, it can be understood that when the introduced trap level density is at least about $5 \times 10^{12}/cm^2$, the influence of the leak current due to the light shielding film 3 can be reduced even in a case where the insulating film 4 is formed to a film thickness of 100 nm to increase the light shielding effect of the light shielding film 3 on the active layer 7 and to reduce the influence of the light leak current.

FIG. 6(*a*) shows in a graph the relationship between the potential applied to the gate electrode 13 and the drain current in a TFT in a comparative example, and FIG. 6(*b*) shows in a graph the relationship between the potential applied to the light shielding film 3 and the drain current. Each of the graphs shown in these figures shows a drain current characteristic of the comparative example TFT having the same sectional structure as that shown in FIG. 2 before the introduction of a trap level into the surface of the active layer 7 on the light shielding film 3 side, and a drain current characteristic of the comparative example TFT after the introduction of the trap level into the surface of the active layer 7 on the light shielding film 3 side. In the comparative example TFT which is used to measure the characteristics shown in FIG. 8 and in which a trap level is introduced into the surface of the active layer 7 on the light shielding film 3 side, the trap level density introduced into the surface of the channel region 27 on the light shielding film 3 side is set higher than the trap level density introduced into the surfaces of the source region 8 and the drain region 9 on the light shielding film 3 side. More specifically, trap level densities shown in a table below are introduced into the regions in the surface portion of the active layer 7 on the insulating film 4 side.

TABLE 1

|  | Channel region | Source region | Drain region |
|---|---|---|---|
| Trap level density | $1.5 \times 10^{13}/cm^2$ | $1.0 \times 10^{13}/cm^2$ | $1.0 \times 10^{13}/cm^2$ |

In the comparative example TFT, the potential (−2 V) applied to the gate electrode 13 when the TFT is off is applied to the light shielding film 3, the potential applied to the gate electrode 13 is changed and the drain current is measured. In the TFT having a trap level introduced into the surface of the active layer 7 on the light shielding film 3 side, the drain current when the TFT is off is smaller than it is before the introduction of the trap level, as shown in FIG. 6(*a*). In this TFT, however, a reduction in drain current when the TFT is on is also observed. Also, the potential applied to the gate electrode 13 is set to a constant value (−2 V), the potential applied to the light shielding film 3 is changed and the drain current is measured. In this case, both a reduction in drain current when the TFT is off and a reduction in drain current when the TFT is on are observed, as shown in FIG. 6(*b*), as are those shown in FIG. 6(*a*).

As described above, in the comparative example TFT in which the trap level density introduced into the surface of the channel region 27 on the light shielding film 3 side is set higher than the trap level density introduced into the surfaces of the source region 8 and the drain region 9 on the light shielding film 3 side, the leak current during the off state can be reduced but the drain current during the on state is simultaneously reduced. This is because the facility with which a channel is formed on the back gate side of the channel region 27, i.e., the gate electrode 13 side of the channel region 27, is reduced due to the introduction of a trap level into the channel region 27 in the surface of the active layer 7 on the light shielding film 3 side. For this reason, it is preferable to avoid excessively introducing a trap level into the channel region 27 in the surface of the active layer 7 on the light shielding film 3 side.

FIG. 7(*a*) shows in a graph the relationship between the potential applied to the gate electrode 13 and the drain current, and FIG. 7(*b*) shows in a graph the relationship between the potential applied to the light shielding film 3 and the drain current. Each of the graphs shown in these figures, as each of those shown in FIGS. 6(*a*) and 6(*b*), shows a drain current characteristic of the TFT before the introduction of a trap level into the surface of the active layer 7 on the light shielding film 3 side, and a drain current characteristic of the TFT after the introduction of the trap level into the surface of the active layer 7 on the light shielding film 3 side. In the TFT 33 which is used to measure the characteristics shown in FIG. 9 and in which a trap level is introduced into the surface of the active layer 7 on the light shielding film 3 side, the trap level density introduced into the surface of the channel region 27 on the light shielding film 3 side is set lower than the trap level density introduced into the surfaces of the source region 8 and the drain region 9 on the light shielding film 3 side. More specifically, trap level densities shown in a table below are introduced into the regions in the surface portion of the active layer 7 on the insulating film 4 side.

TABLE 2

|  | Channel region | Source region | Drain region |
|---|---|---|---|
| Trap level density | $8 \times 10^{11}/cm^2$ | $1.2 \times 10^{13}/cm^2$ | $1.2 \times 10^{13}/cm^2$ |

Figure 6A:
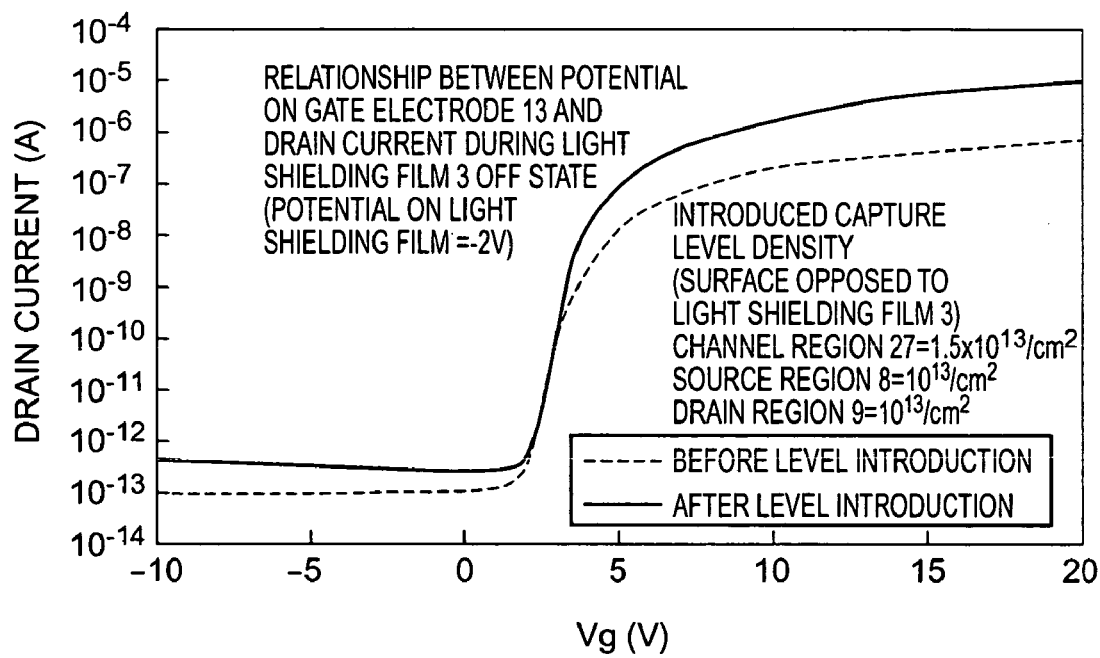
FIG. 6(a) is a graph showing the relationship between the potential applied to the gate electrode 13 and the drain current.
Figure 6B:
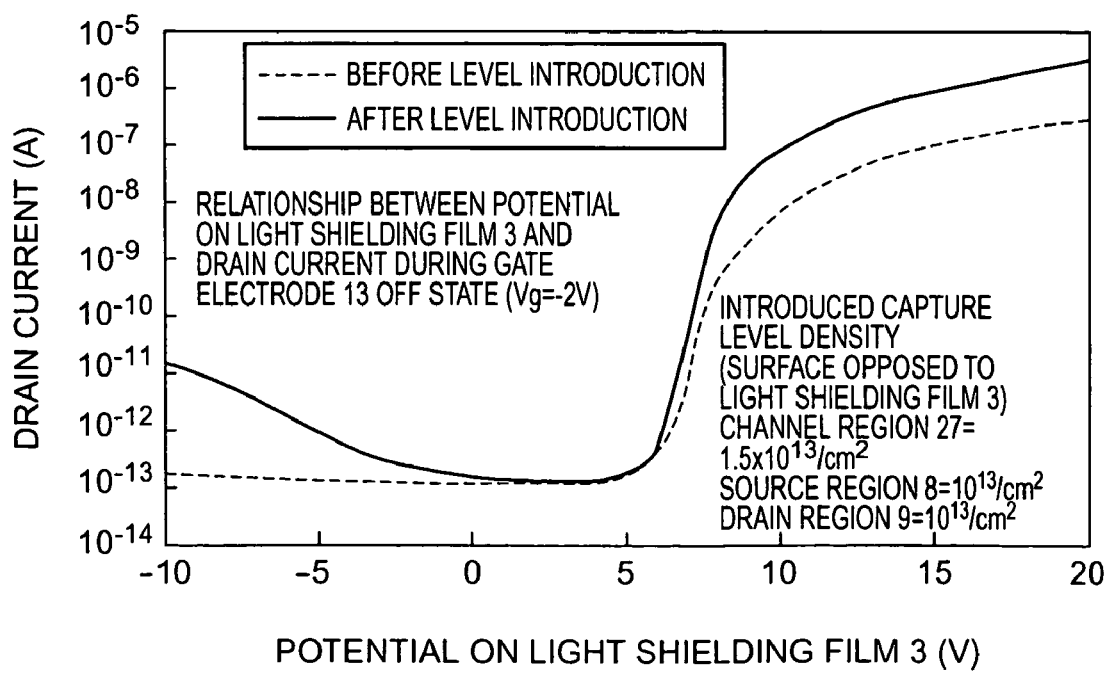
FIG. 6(b) is a graph showing the relationship between the potential applied to the light shielding film 3 and the drain current.
Figure 7A:
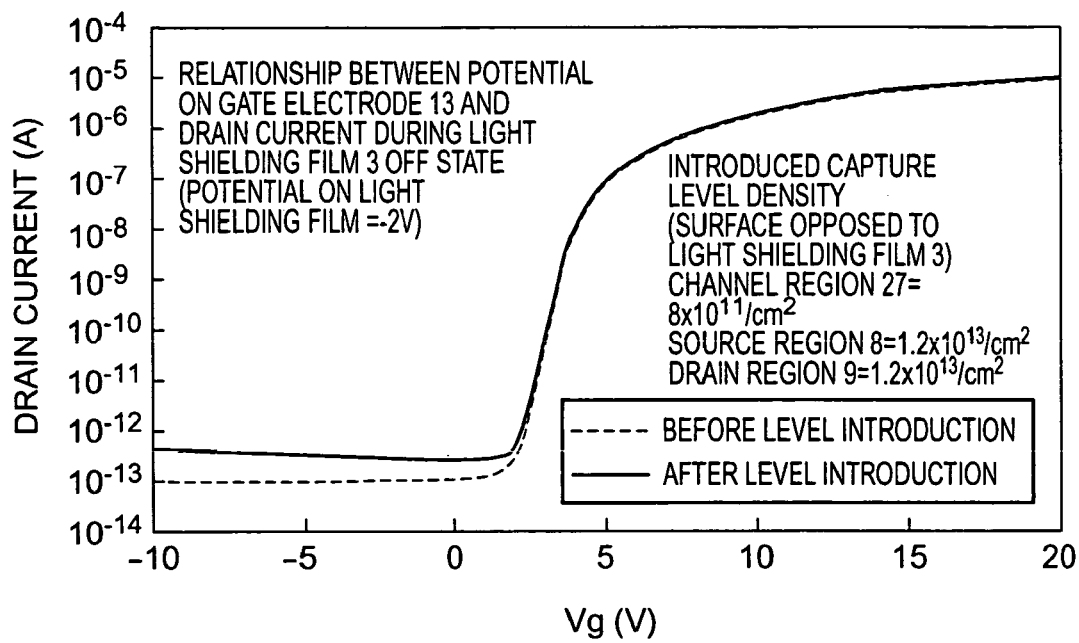
FIG. 7(a) is a graph showing the relationship between the potential applied to the gate electrode 13 and the drain current.
Figure 7B:
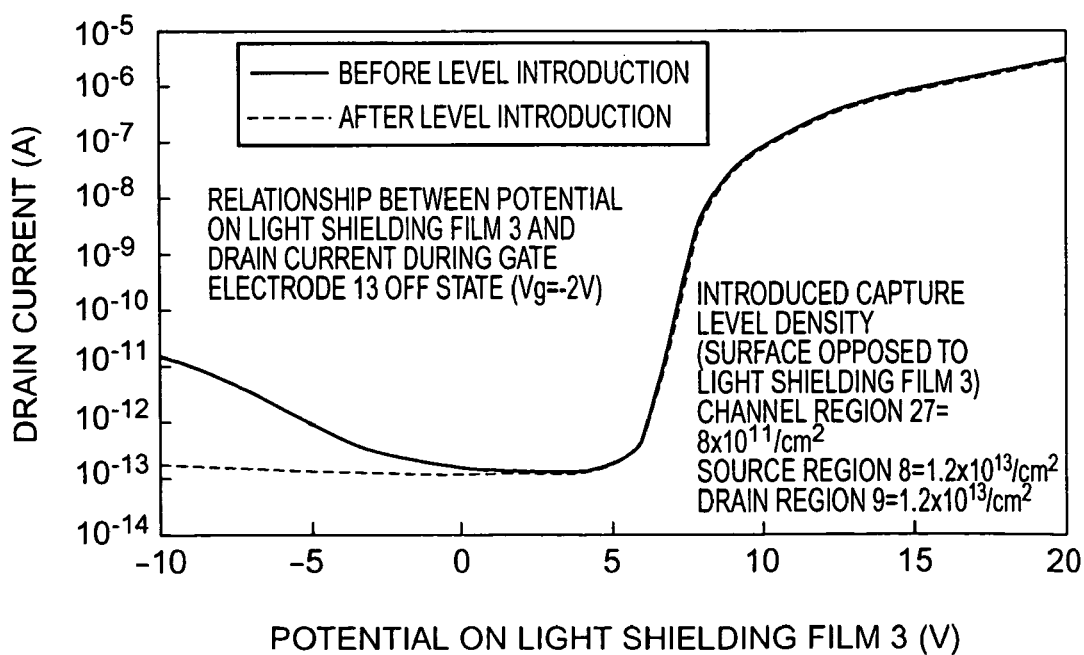
FIG. 7(b) is a graph showing the relationship between the potential applied to the light shielding film 3 and the drain current.

Referring to FIG. 7(*a*), the drain current was measured in the same manner as in the case shown in FIG. 6(*a*), that is, the voltage applied to the light shielding film 3 was set to a constant value (−2 V), the potential applied to the gate electrode 13 was changed and the drain current was measured. In the TFT 33 having a trap level introduced into the surface of the active layer 7 on the light shielding film 3 side, substantially no reduction in drain current when the TFT was on was observed, in contrast with the case shown in FIG. 6(a), while the drain current when the TFT was off was smaller than it was before the introduction of the trap level, as shown in FIG. 7(a), as is that in the case shown in FIG. 6(a). Also when the drain current was measured by setting the potential applied to the gate electrode 13 to a constant value (−2 V) and by changing the potential applied to the light shielding film 3 as in the case shown in FIG. 6(b), substantially no reduction in drain current when the TFT was on was observed, as shown in FIG. 7(b), as in the case shown in FIG. 7(a), while the leak current when the TFT was off was reduced. Thus, if a trap level is not excessively introduced into the surface of the channel region 27 on the light shielding film 3 side in the active layer 7, the leak current when the TFT is off can be reduced and a reduction in drain current when the TFT is on can be prevented.

When electrical stress is applied by applying potentials such as those mentioned above to the electrodes and by maintaining the state in which the potentials are applied to the electrodes, in the insulating film 4, the strength of the electric field in the region between the channel region 27 and the light shielding film 3 is reduced, and the strength of the electric field in each of the region between the source region 8 and the light shielding film 3 and the region between the drain region 9 and the light shielding film 3 is increased. At this time, in the insulating film 4, no current is caused in the region between the channel region 27 and the light shielding film 3, while a current is caused in the region between the source region 8 and the light shielding film 3 and in the region between the drain region 9 and the light shielding film 3. In this manner, a trap level can be selectively introduced into the regions in the surface portion of the active layer 7 on the light shielding film 3 side corresponding to the source region 8 and the drain region 9. In the TFT 33 formed by applying potentials such as those described above to the electrodes, therefore, the leak current when the TFT is off is reduced but no reduction in drain current when the TFT is on is observed, as shown in FIGS. 7(a) and 7(b), and no deterioration is caused in write characteristic or the like.

In this embodiment, in the TFT a trap level is introduced at a density at least about $5 \times 10^{12}/cm^2$ into the regions corresponding to the source region 8 and the drain region 9 in the surface portion of the active layer 7 on the side opposed to the light shielding film 3 to reduce the electrical influence of the light shielding film 3 on the active layer 7. Therefore, even in a case where the distance between the light shielding film 3 and the active layer 7 is reduced in order to reduce the influence of a light leak current, a deterioration in TFT characteristics such as an off-leak current caused by the electrical influence of the light shielding film 3 can be limited. In other words, in the TFT 33, both a deterioration in TFT characteristic due to a light leak current and a deterioration in TFT characteristic due to the electrical influence of the light shielding film 3 when the light shielding effect of the light shielding film 3 is improved can be simultaneously limited. The liquid crystal display device using this TFT substrate 32 is capable of maintaining good display quality even when the luminance of backlight emitted from a light source is increased. Thus, the liquid crystal display device can be realized as a high-luminance high-optical-contrast display device.

If a trap level is excessively introduced into a region in the channel region 27 in the surface portion of the active layer 7 on the light shielding film 3 side, a leak current when the TFT is off can be reduced but the drain current when the TFT is on is also reduced, as described above. In this embodiment, the trap level density in the channel region 27 in the surface portion of the active layer 7 on the light shielding film 3 side is set lower than the trap level density in the source region 8 and the drain region 9. Therefore, a leak current when the TFT is off can be reduced while a reduction in drain current when the TFT is on can be limited.

In this embodiment, a trap level is introduced into the surface of the active layer 7 on the light shielding film 3 side by means of a current in the insulating film 4 caused in such a manner that electrical stress is applied to the insulating film 4 between the light shielding film 3 and the active layer 7 by applying predetermined potentials to the electrodes. Therefore, the TFT substrate 32 in which both a deterioration in TFT characteristic due to a light leak current and a deterioration in TFT characteristic due to the electrical influence of the light shielding film 3 are limited can be fabricated without adding any complicated process step and without reducing the throughput. The manufacturing process after the introduction of the desired trap level does not include any step in which the temperature exceeds 600° C., the maximum reached temperature is about 400° C. at the maximum and no compensation is made for the introduced trap level.

If the film thickness of the insulating film 4, i.e., the distance between the light shielding film 3 and the active layer 7, is set to 400 nm or more, the amount of light reaching the active layer 7 is increased and the light leak current is considerably large. If the film thickness of the insulating film 4 is set to 100 nm or less, the electrical influence of the light shielding film 3 on the active layer 7 cannot be sufficiently reduced even when a trap level is introduced into the surface portion of the active layer 7 on the light shielding film 3 side, resulting in a considerable deterioration in characteristics of the TFT 33. Therefore, it is preferable to set the film thickness of the insulating film 4 to 100 to 400 nm. It is particularly preferable in terms of light shielding effect to set the film thickness to 100 to 250 nm.

Figure 8A:
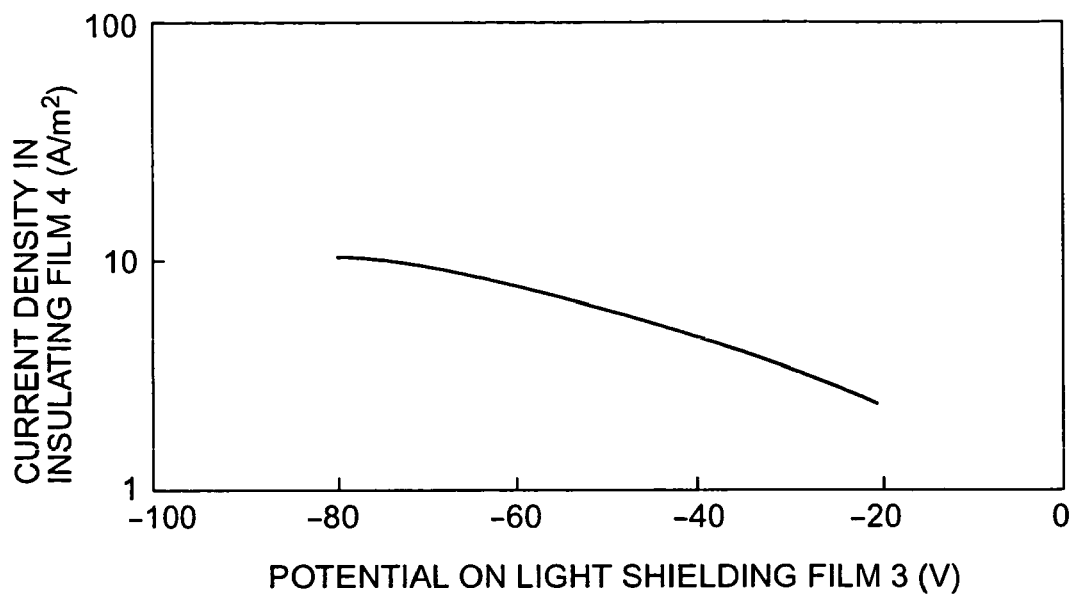
FIG. 8(a) is a graph showing the relationship between the potential applied to the light shielding film 3 and the current density in the insulating film 4.
Figure 8B:
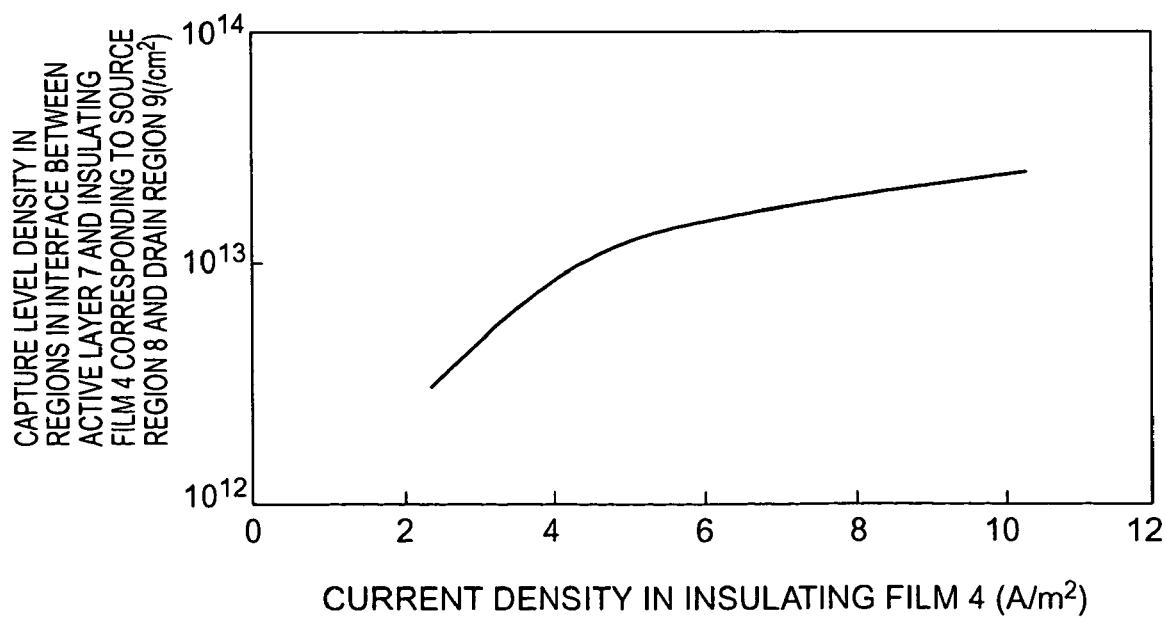
FIG. 8(b) is a graph showing the relationship between the current density in the insulating film 4 and the trap level density introduced into the surfaces opposed to the source region 8 and the drain region 9 in the surface portion of the active layer 7 on the light shielding film 3 side.

FIG. 8(a) shows the relationship between the potential applied to the light shielding film 3 and the current density in the insulating film 4 when a trap level is introduced, and FIG. 8(b) shows the relationship between the current density in the insulating film 4 and the trap level density introduced in the surface of the active layer 7 on the light shielding film 3 side. For introduction of a trap level into the surface of the active layer 7 on the light shielding film 3 side, ground potential was applied to the gate electrode 13, the source electrode 15 and the drain electrode 16 and the potential on the light shielding film 3 was changed in the range from −20 to −80 V. The current density of the current flowing in the insulating film 4 at this time was changed as shown in FIG. 8(a). Also, the density of the trap level introduced into regions in the source region 8 and the drain region 9 in the surface portion of the active layer 7 on the light shielding film 3 side was changed by the current density of the current flowing in the insulating film 4 as shown in FIG. 8(b).

With the increase in the negative voltage applied to the light shielding film 3, the current density of the current flowing in the insulating film 4 increases as shown in FIG. 8(a). Also, with the increase in the current density of the current flowing in the insulating film 4, the trap level density introduced into the insulating film 4 and the regions in the drain region 9 and the source region 8 at the interface between the insulating film 4 and the active layer 7 increases as shown in FIG. 8(b). That is, in application of electrical stress, the introduced trap level density increases as the negative voltage applied to the light shielding film 3 is increased. If the film thickness of the insulating film 4 is changed, the relationship shown in FIG. 8(a) and the relationship shown in FIG. 8(b) are changed. In such a case, however, the potentials applied to the electrodes may be set so that the current density of the current flowing in the insulating film 4 is at least about 2.5 A/m$^2$ to introduce the desired trap level into the insulating film 4 and the regions in the drain region 9 and the source region 8 at the interface between the insulating film 4 and the active layer 7.

Each of FIGS. 9(a) to 9(d) shows the relationship between the potential on the light shielding film 3 and the drain current in the TFT 33. Each of these graphs shows a leak current (drain current) characteristic depending on the light shielding film 3 when a potential for turning off the TFT is applied to the gate electrode 13 in the TFT before the introduction of a trap level into the insulating film 4 and regions in the drain region 9 and the source region 8 at the interface between the insulating film 4 and the active layer 7, and in the TFT 33 after the introduction of the trap level. When the trap level was introduced into the insulating film 4 and regions in the drain region 9 and the source region 8 at the interface between the insulating film 4 and the active layer 7, ground potential was applied to the gate electrode 13, the source electrode 15 and the drain electrode 16 to apply electrical stress between the active layer 7 and the light shielding film 3, thereby causing a current in the insulating film 4. This state was maintained for one minute.

Figure 9A:
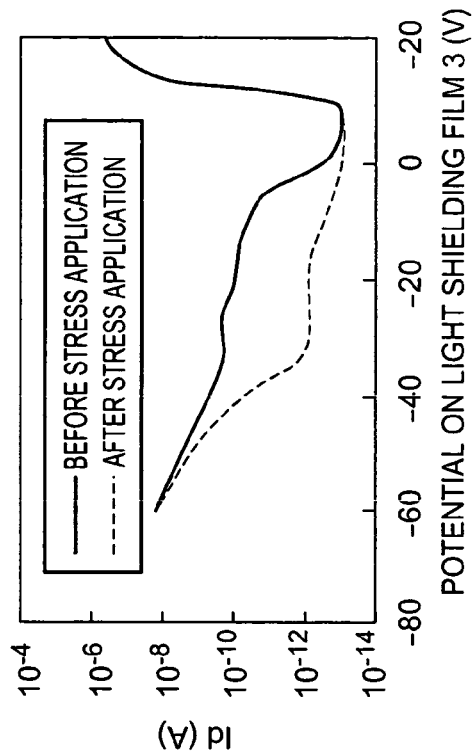
FIGS. 9(a) to 9(d) are graphs each showing the relationship between the potential on the light shielding film 3 and the drain current in TFT 33.

The graph shown in FIG. 9(a) shows a leak current characteristic of the TFT 33 when a potential of −20 V was applied to the light shielding film 3 at the time of application of electrical stress. The current density of the current flowing in the insulating film 4 at this time was 2 A/m$^2$ and the trap level was introduced by this current into the insulating film 4 and regions in the interface between the insulating film 4 and the active layer 7 corresponding to the drain region 9 and the source region 8. It can be understood that the drain current when the TFT was off after the introduction of the trap level was reduced in comparison with the drain current before the introduction of the trap level into the active layer 7 to limit a deterioration in characteristic of the TFT 33. Also, the range of potential applied to the light shielding film 3 in which the drain current is equal to or smaller than 3 pA was increased. Therefore, even if variation in characteristic exists in the TFT substrate 33 when the same potential is applied to the light shielding films 3 placed in correspondence with of a plurality of TFTs 33, a potential can be set at the light shielding films 3 such that the off-leak current caused due to the electrical influence of the light shielding films 3 can be set to 3 pA or less in all the TFTs 33, and the liquid crystal display device having this TFT substrate 32 is capable of avoiding a reduction in display quality.

Figure 9C:
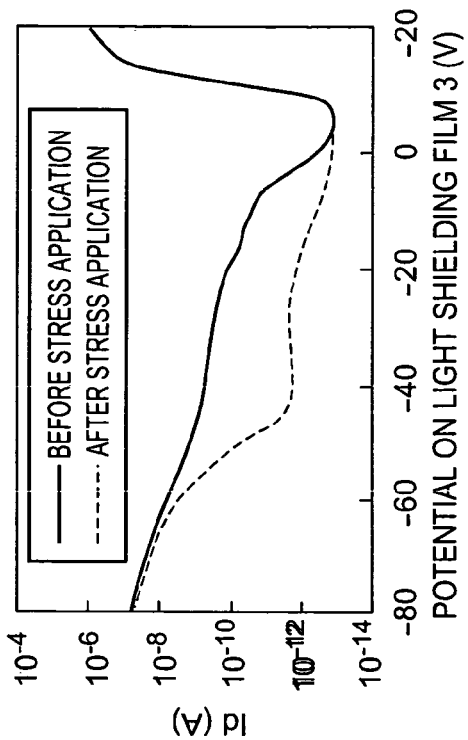
Figure 9B:
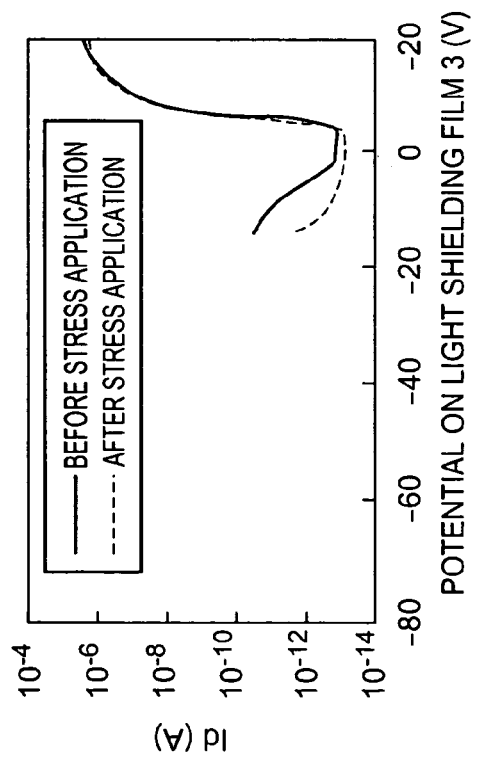
Figure 9D:
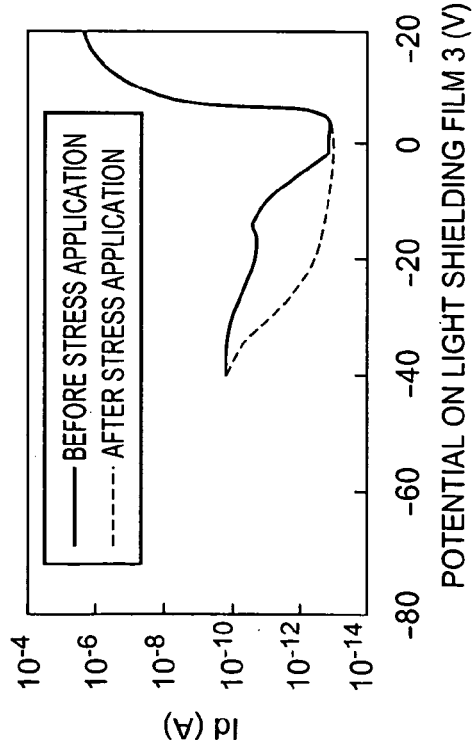

The graph shown in FIG. 9(b) shows a leak current characteristic of the TFT 33 in which a potential of −40 V was applied to the light shielding film 3 at the time of application of electrical stress. FIG. 9(c) shows a leak current characteristic of the TFT 33 in which a potential of −60 V was applied to the light shielding film 3 at the time of application of electrical stress. FIG. 9(d) shows a leak current characteristic of the TFT 33 in which a potential of −80 V was applied to the light shielding film 3 at the time of application of electrical stress. As the potential applied to the light shielding film 3 at the time of introduction of a trap level into the insulating film 4 and regions in the interface between the insulating film 4 and the active layer 7 corresponding to the drain region 9 and the source region 8 by electrical stress is increased to −40 V, −60 V and to −80 V, the range of potential applied to the light shielding film 3 in which the drain current is equal to or smaller than 3 pA when the TFT is off is increased as shown in FIGS. 9(c) and 9(d). Thus, even if large variation in characteristic exists, the desired display quality of the liquid crystal display device can be maintained by setting the light shielding film 3 to a certain potential.

Second Embodiment

Figure 10:
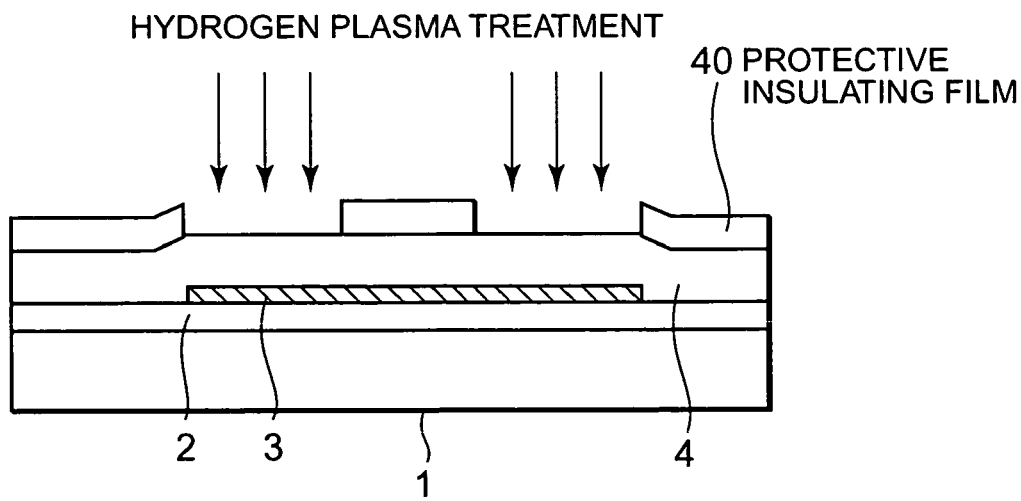
FIG. 10 is a cross-sectional view of a TFT substrate in one fabrication step in a second embodiment of the present invention.

FIG. 10 shows one step in the process of manufacturing a TFT substrate in a second embodiment of the present invention. The process of manufacturing the TFT substrate 32 in this embodiment differs partly from that in the first embodiment. The TFT substrate in this embodiment has the same planar structure as that shown in FIG. 1 and the same sectional structure as that shown in FIG. 2. In the above-described first embodiment, electrical stress is applied after the formation of the TFT substrate 32 to introduce a trap level into the insulating film 4 and regions in the drain region 9 and the source region 8 at the interface between the insulating film 4 and the active layer 7. In this embodiment, a hydrogen plasma treatment is performed on the surface of the insulating film 4 before the formation of the active layer 7 on the insulating film 4 to damage the surface of the insulating film 4 on the active layer 7 side, thereby introducing a trap level into the interface between the insulating film 4 and the active layer 7, i.e., regions in the source region 8, the drain region 9 and the low-concentration carrier regions 11 and 12 in the surface of the active layer 7 on the light shielding film 3 side.

Figure 3A:
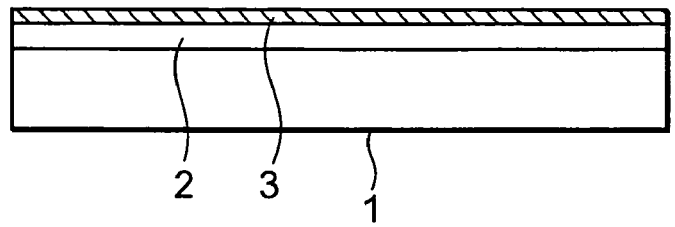
FIGS. 3(a) to 3(h) are cross-sectional views of the thin-film transistor array substrate having a sectional structure shown in FIG. 2, the substrate being shown with respect to manufacturing steps.
Figure 3B:
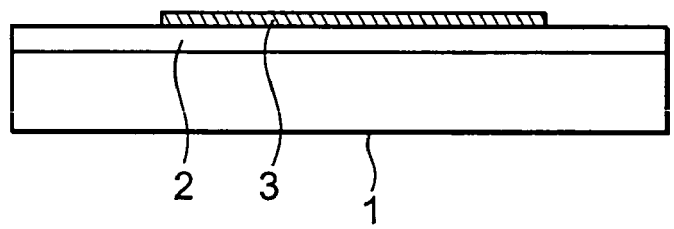
Figure 3C:
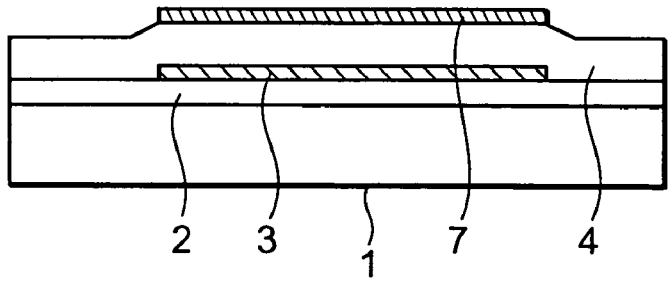
Figure 3D:
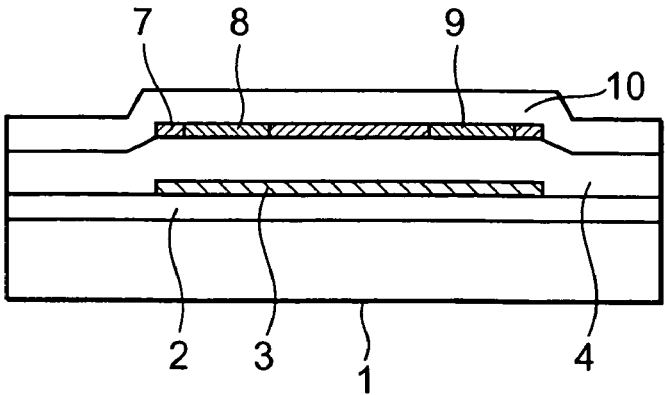
Figure 3E:
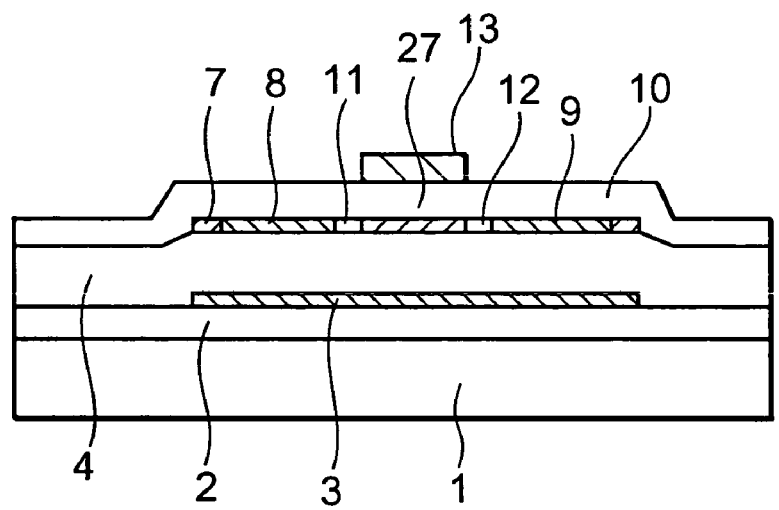
Figure 3F:
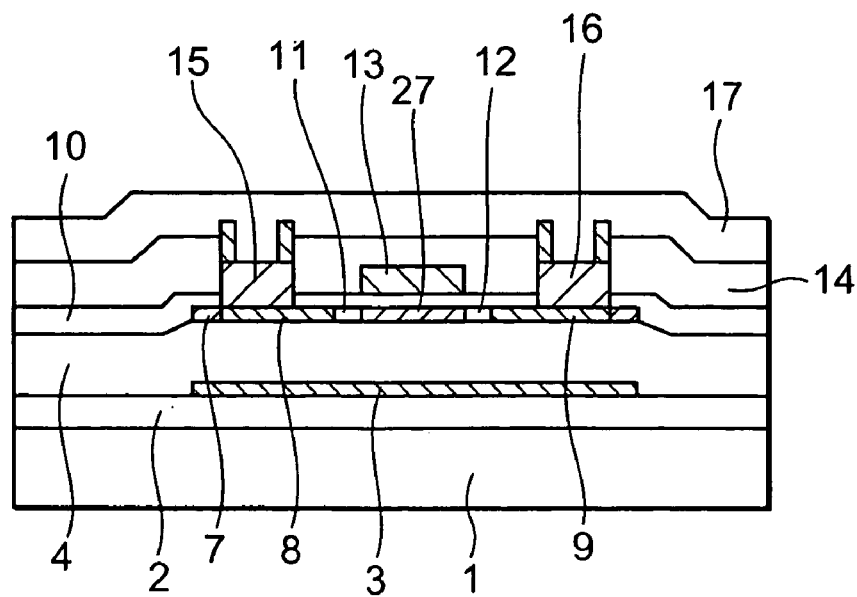
Figure 3G:
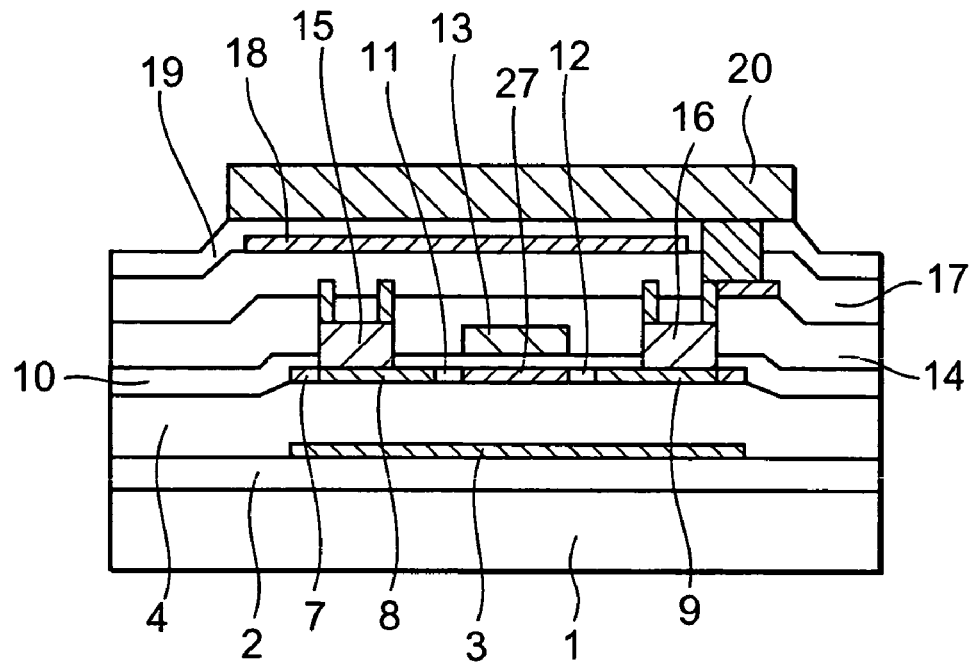
Figure 3H:
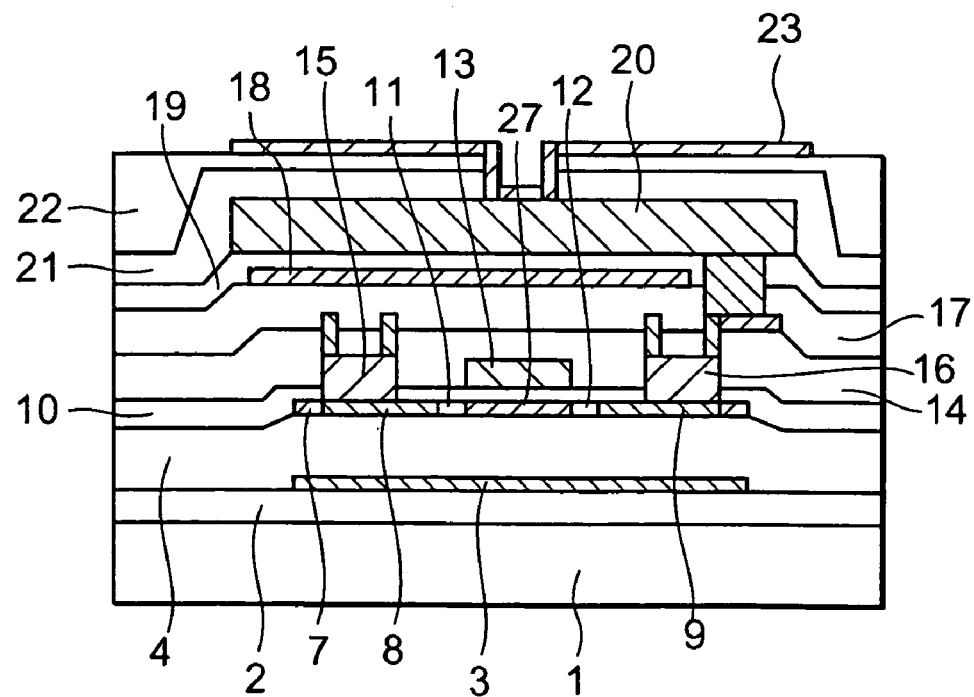

The TFT substrate 32A in this embodiment is fabricated as described below. The base insulating film 2 and the light shielding film 3 are formed on the glass substrate 1 in the same manner as shown in FIGS. 3(a) and 3(b). The insulating film 4 is formed on the light shielding film 3. By using a photolithography method, a protective insulating film 40 is formed to a film thickness of 100 nm in regions on the insulating film 4 other than the regions corresponding to the source region 8, the drain region 9 and the low-concentration carrier regions 11 and 12 of the active layer 7 to be formed. After the formation of the protective insulating film 40, a hydrogen plasma treatment is performed on the entire substrate surface under conditions: RF power of about 2500 W, a hydrogen gas pressure of about 400 Pa, a hydrogen gas flow rate of about 400 sccm, and a temperature of about 370° C. (FIG. 10). After the introduction of a trap level into the interface of the insulating film 4 on the active layer 7, the protective insulating film 40 is removed and the active layer 7 is formed on the insulating film 4 in the same manner as in FIG. 3(c). Thereafter, the same steps as those in the first embodiment are performed to fabricate the TFT substrate 32 having the same sectional structure as that shown in FIG. 2 (FIG. 3(g)).

Figure 11:
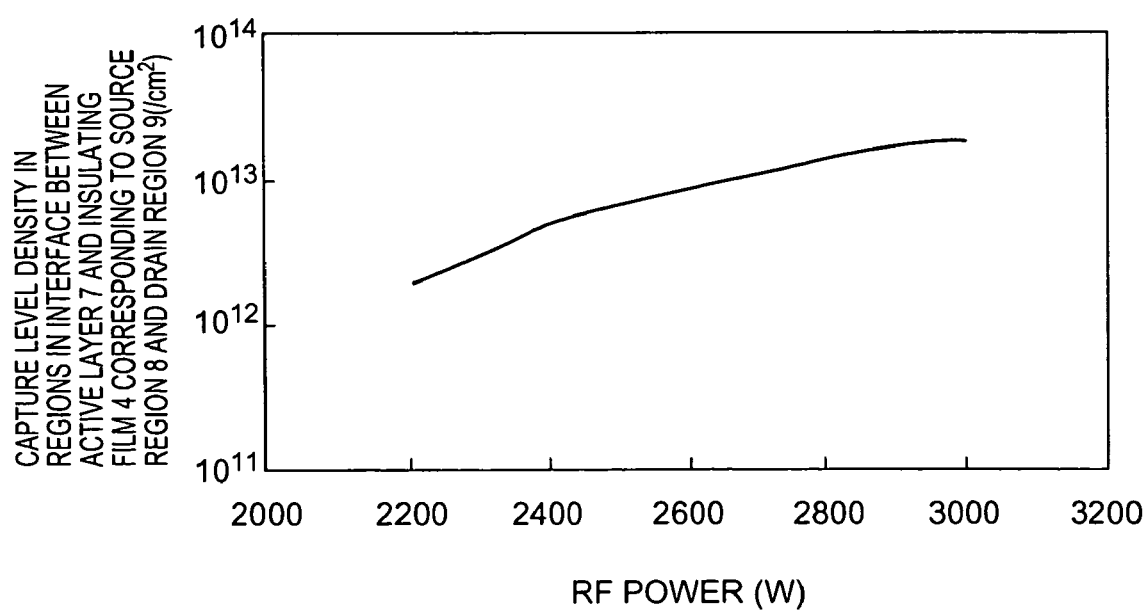
FIG. 11 is a graph showing the relationship between RF power for hydrogen plasma treatment and the trap level density introduced into the insulating film 4.

FIG. 11 shows the relationship between the RF power for the hydrogen plasma treatment and the trap level density introduced into the insulating film 4. As shown in FIG. 11, if the RF power for the hydrogen plasma treatment is set to at least about 2200 W, a trap level can be introduced at a density at least about 5×10$^{12}$/cm$^2$ into regions in the source region 8, the drain region 9 and the low-concentration carrier regions 11 and 12 in the surface of the active layer 7 on the light shielding film 3 side.

FIG. 12(a) shows in a graph the relationship between the potential applied to the gate electrode 13 and the drain current, and FIG. 12(b) shows in a graph the relationship between the potential applied to the light shielding film 3 and the drain current. Each of the graphs shown in FIGS. 12(a) and 12(b) shows a drain current characteristic of the TFT before the introduction of a trap level into regions in the source region 8, the drain region 9 and the low-concentration carrier regions 11 and 12 in the surface of the active layer 7 on the light shielding film 3 side, and a drain current characteristic of the TFT after the introduction of the trap level. At the time of introduction of the trap level into regions in the source region 8, the drain region 9 and the low-concentration carrier regions 11 and 12 in the surface of the active layer 7 on the light shielding film 3 side, a hydrogen plasma treatment at RF power of 2500 W was used.

Figure 12:
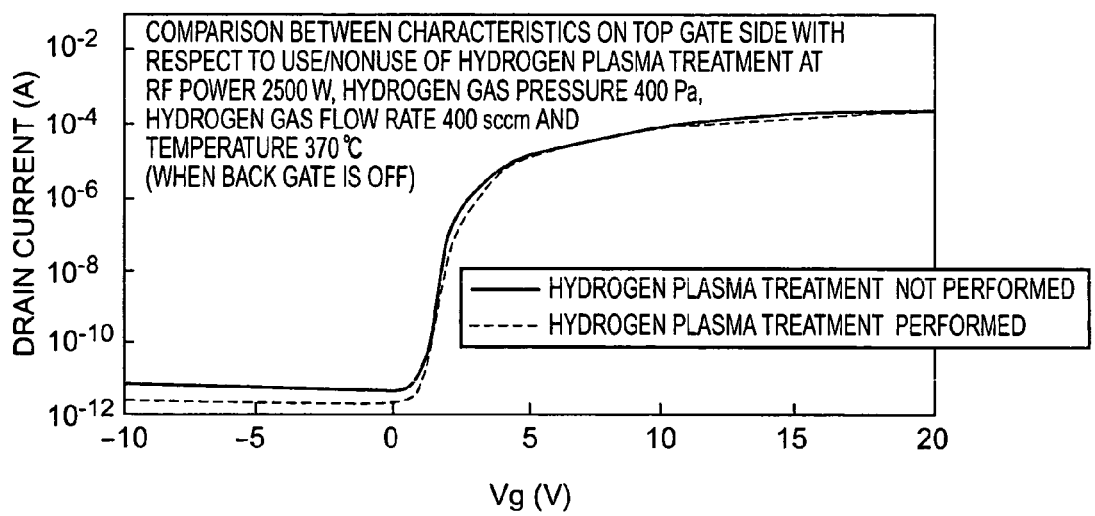
FIG. 12(a) is a graph showing the relationship between the potential applied to the gate electrode 13 and the drain current.
FIG. 12(b) is a graph showing the relationship between the potential applied to the light shielding film 3 and the drain current.
Figure 12:
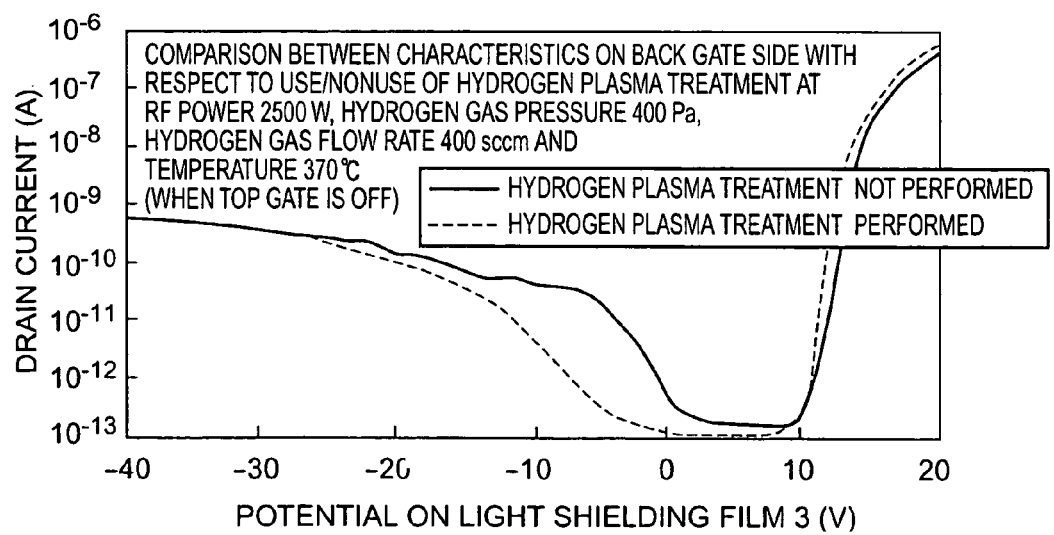

Referring to FIG. 12(*a*), the drain current was measured in the same manner as in the case shown in FIG. 7(*a*), that is, the voltage applied to the light shielding film 3 was set to a constant value (−2 V), the potential applied to the gate electrode 13 was changed and the drain current was measured. In the TFT 33 having the trap level introduced into the surface of the active layer 7 on the light shielding film 3 side, substantially no reduction in drain current when the TFT was on was observed while the drain current when the TFT was off was smaller than it was before the introduction of the trap level, as shown in FIG. 12(*a*). Also when the drain current was measured by setting the potential applied to the gate electrode 13 to a constant value (−2 V) and by changing the potential applied to the light shielding film 3 as in the case shown in FIG. 7(*b*), substantially no reduction in drain current when the TFT was on was observed, as shown in FIG. 12(*b*), while the leak current when the TFT was off was smaller than it was before the introduction of the trap level.

Also in the case of introducing a trap level into regions in the source region 8, the drain region 9 and the low-concentration carrier regions 11 and 12 in the surface of the active layer 7 on the light shielding film 3 side by performing a hydrogen plasma treatment as in this embodiment, the TFT 33 capable of being designed to reduce the leak current when the TFT is off while limiting the reduction in drain current when the TFT is on can be obtained without adding any complicated process step and without reducing the throughput, as in the case of the first embodiment. Also, both a deterioration in TFT characteristic due to a light leak current and a deterioration in TFT characteristic due to the electrical influence of the light shielding film 3 when the light shielding effect of the light shielding film 3 is improved can be simultaneously limited. In a liquid crystal display device using the TFT substrate 32 fabricated in accordance with this embodiment, therefore, good display quality can be maintained even when the luminance of backlight emitted from a light source is increased.

Third Embodiment

Figure 13:
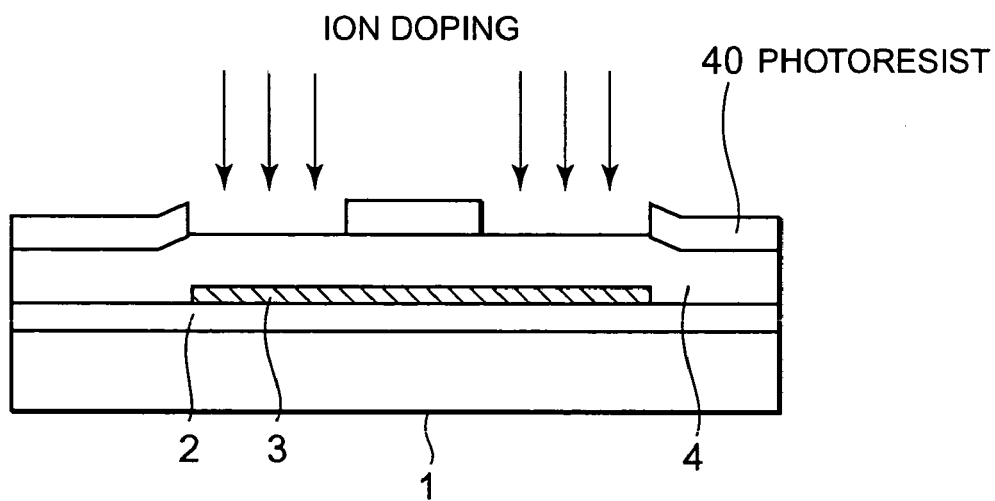
FIG. 13 is a cross-sectional view of a TFT substrate in one fabrication step in a third embodiment of the present invention.

FIG. 13 shows one step in the process of manufacturing a TFT substrate in a third embodiment of the present invention. The TFT substrate in this embodiment has the same planar structure as that shown in FIG. 1 and the same sectional structure as that shown in FIG. 2. In the above-described second embodiment, a hydrogen plasma treatment is performed on the surface of the insulating film 4 to introduce a trap level into the surface of the active layer 7 on the light shielding film 3 side. In the third embodiment, a carrier is implanted in the insulating film 4 to introduce a trap level into regions in the source region 8, the drain region 9 and the low-concentration carrier regions 11 and 12 in the surface of the active layer 7 on the light shielding film 3 side.

The TFT substrate 32 in this embodiment is fabricated as described below. The base insulating film 2 and the light shielding film 3 are formed on the glass substrate 1 in the same manner as shown in FIGS. 3(*a*) and 3(*b*). The insulating film 4 is formed on the light shielding film 3, and a photoresist 41 is formed on the insulating film 4. The photoresist 41 is formed in regions on the insulating film 4 other than the regions corresponding to the source region 8, the drain region 9 and the low-concentration carrier regions 11 and 12 of the active layer 7 to be formed on the insulating film 4, as is the protective insulating film 40 (FIG. 10). After the formation of the photoresist 41, a carrier is implanted in the surface of the insulating film 4 by an ion doping method using a gas of phosphorus and oxygen or the like at an acceleration voltage of about 35 keV and a dose rate of $10^{13}/cm^2$ (FIG. 13).

By the above-described carrier implantation, a trap level can be introduced at a density at least about $5 \times 10^{12}/cm^2$ into the surface of the insulating film 4 on the active layer 7 side, i.e., regions in the interface of the insulating film 4 on the active layer 7 corresponding to the source region 8, the drain region 9 and the low-concentration carrier regions 11 and 12. After the introduction of the trap level into the regions in the surface of the insulating film 4 on the active layer 7 side corresponding to the source region 8, the drain region 9 and the low-concentration carrier regions 11 and 12, the photoresist 41 is removed and the active layer 7 is formed on the insulating film 4 in the same manner as in FIG. 3(*c*). Thereafter, the same steps as those in the first embodiment are performed to fabricate the TFT substrate 32 having the same sectional structure as that shown in FIG. 2 (FIG. 3(*g*)).

Figure 14:
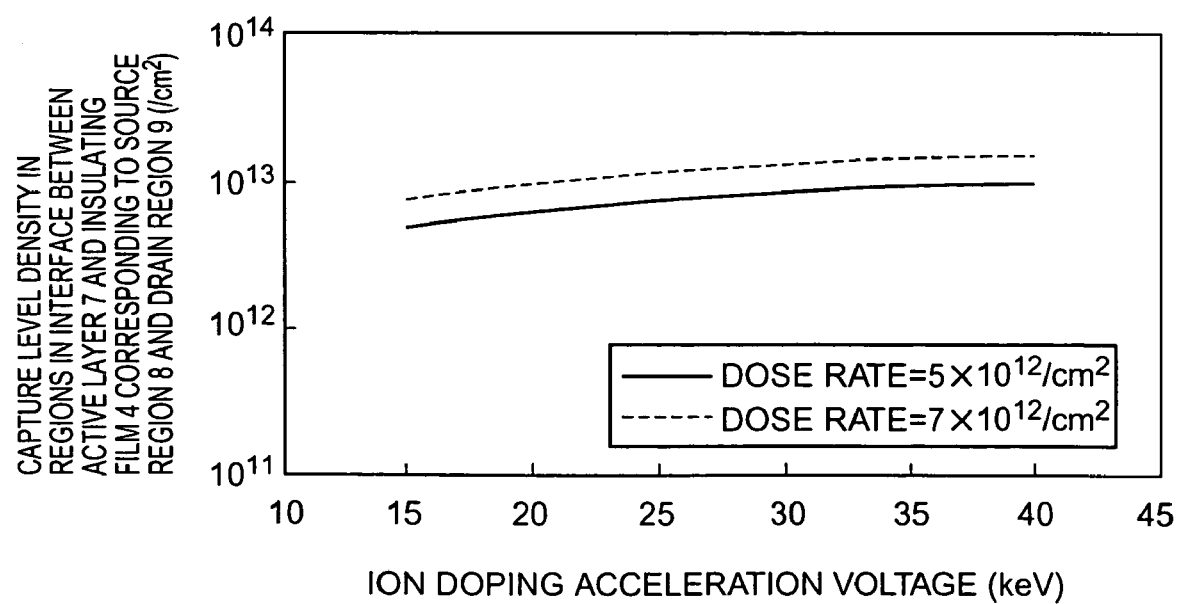
FIG. 14 is a graph showing the relationship between the acceleration voltage at the time of ion doping and the trap level density introduced into the surface of the active layer 7 on the light shielding film 3 side.

FIG. 14 shows the relationship between the acceleration voltage at the time of ion doping and the trap level density introduced into the surface of the active layer 7 on the light shielding film 3 side. The introduced trap level density depends on the acceleration voltage and the dose rate at the time of ion doping. As shown in FIG. 14, in a case where the dose rate is set to $5 \times 10^{12}/cm^2$ for example, the acceleration voltage at the time of ion doping may be set to at least about 15 keV to introduce the trap level into the surface of the active layer 7 on the light shielding film 3 side at a density at least about $5 \times 10^{12}/cm^2$.

Figure 15A:
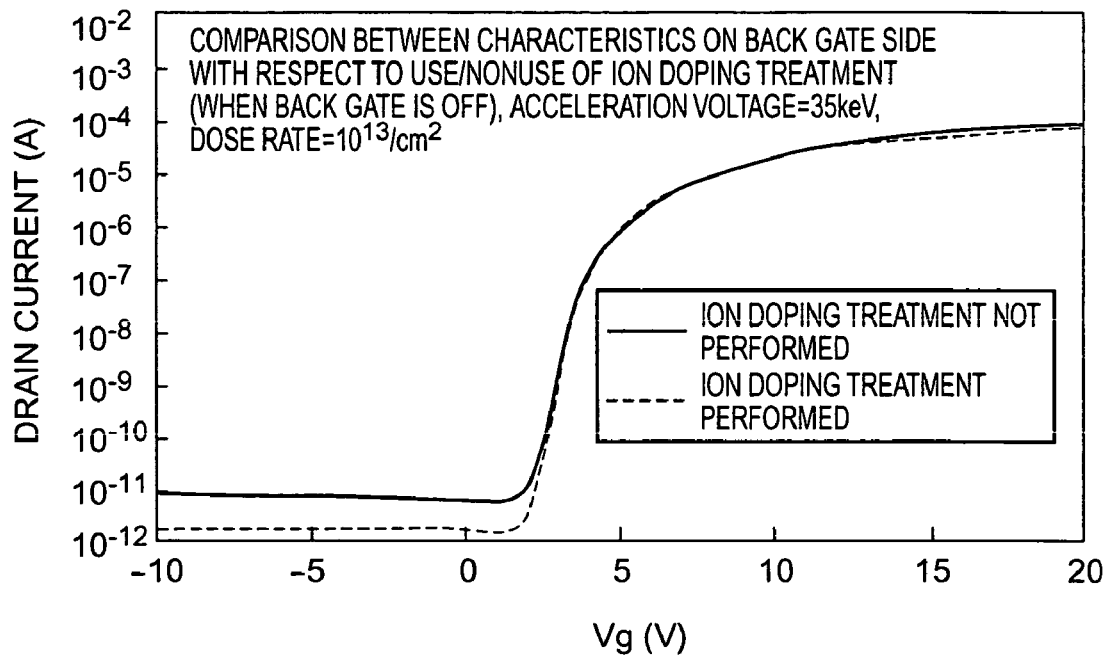
FIG. 15(a) is a graph showing the relationship between the potential applied to the gate electrode 13 and the drain current.
Figure 15B:
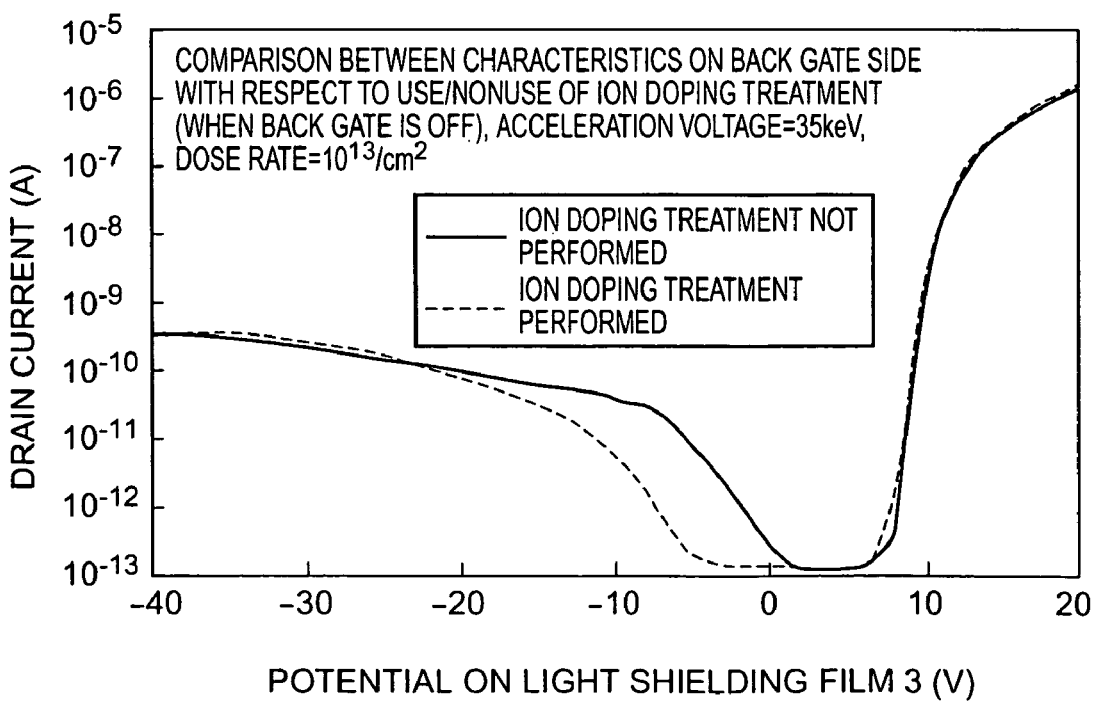
FIG. 15(b) is a graph showing the relationship between the potential applied to the light shielding film 3 and the drain current.

FIG. 15(*a*) shows in a graph the relationship between the potential applied to the gate electrode 13 and the drain current, and FIG. 15(*b*) shows in a graph the relationship between the potential applied to the light shielding film 3 and the drain current. Each of the graphs shown in FIGS. 15(*a*) and 15(*b*) shows a drain current characteristic of the TFT before the introduction of a trap level into regions in the interface of the insulating film 4 on the active layer 7 corresponding to the source region 8, the drain region 9 and the low-concentration carrier regions 11 and 12, and a drain current characteristic of the TFT after the introduction of the trap level. At the time of introduction of the trap level into the interface of the insulating film 4 on the active layer 7, ion doping under conditions: an acceleration voltage of 35 keV and a dose rate of $10^{13}/cm^2$ was used.

Referring to FIG. 15(*a*), the drain current was measured in the same manner as in the case shown in FIG. 7(*a*), that is, the voltage applied to the light shielding film 3 was set to a constant value (−2 V), the potential applied to the gate electrode 13 was changed and the drain current was measured. In the TFT 33 having the trap level introduced into the regions in the interface of the insulating film 4 on the active layer 7 corresponding to the source region 8, the drain region 9 and the low-concentration carrier regions 11 and 12, substantially no reduction in drain current when the TFT was on was observed while the drain current when the TFT was off was smaller than it was before the introduction of the trap level, as shown in FIG. 15(*a*). Also when the drain current was measured by setting the potential applied to the gate electrode 13 to a constant value (−2 V) and by changing the potential applied to the light shielding film 3 as in the case shown in FIG. 7(*b*), substantially no reduction in drain current when the TFT was on was observed, as shown in FIG. 15(*b*), while the leak current when the TFT was off was smaller than it was before the introduction of the trap level.

Also in the case of introducing a trap level at a density at least about $5 \times 10^{12}/\text{cm}^2$ into the regions in the interface of the insulating film 4 on the active layer 7 corresponding to the source region 8, the drain region 9 and the low-concentration carrier regions 11 and 12 by implanting impurity ions in the insulating film 4 by an ion doping method as in this embodiment, the TFT 33 capable of being designed to reduce the leak current when the TFT is off while limiting the reduction in drain current when the TFT is on can be obtained without adding any complicated process step and without reducing the throughput, as in the case of the first and second embodiments. Also, both a deterioration in TFT characteristic due to a light leak current and a deterioration in TFT characteristic due to the electrical influence of the light shielding film 3 when the light shielding effect of the light shielding film 3 is improved can be simultaneously limited. In a liquid crystal display device using the TFT substrate 32 fabricated in accordance with this embodiment, therefore, good display quality can be maintained even when the luminance of backlight emitted from a light source is increased.

Fourth Embodiment

A TFT substrate in a fourth embodiment of the present invention has the same planar structure as that of the TFT substrate 32 shown in FIG. 1 and the same sectional structure as that of the TFT substrate 32 shown in FIG. 2. The process of fabricating the TFT substrate in the fourth embodiment differs partly from the first to third embodiments. In the above-described third embodiment, a photoresist 41 is formed on the insulating film 4 and a trap level is introduced into regions in the interface of the insulating film 4 on the active layer 7 corresponding to the source region 8, the drain region 9 and the low-concentration carrier regions 11 and 12 by using an ion doping method. In this embodiment, a trap level is introduced into regions in the source region 8, the drain region 9 and the low-concentration carrier regions 11 and 12 in the surface portion of the active layer 7 on the light shielding film 3 side by carrier implantation at the time of formation of the low-concentration carrier regions 11 and 12.

The TFT substrate 32 in this embodiment is fabricated as described below. The base insulating film 2, the light shielding film 3, the insulating film 4, the active layer 7 in which the source region 8 and the drain region 9 are formed and the gate insulating film 10 are formed on the glass substrate 1 in the same manner as shown in FIGS. 3(*a*) to 3(*d*). Referring to FIG. 3(*e*), the gate electrode 13 is formed and the low-concentration carrier regions 11 and 12 are formed by carrier implantation. In this carrier implantation, a carrier is implanted by adjusting the dose rate and the acceleration voltage so that the trap level density introduced into the regions in the source region 8, the drain region 9 and the low-concentration carrier regions 11 and 12 in the surface portion of the active layer 7 on the light shielding film 3 side is at least about $5 \times 10^{12}/\text{cm}^2$.

In the above-described carrier implantation, because of a difference in mass the carrier has a peak in its concentration distribution at the surface of the active layer 7 on the gate electrode 13 side, while hydrogen implanted together with the carrier has a peak in its concentration distribution at the surface of the active layer 7 on the light shielding film 3 side. The trap level is thereby introduced at a density at least about $5 \times 10^{12}/\text{cm}^2$ into regions in the source region 8, the drain region 9 and the low-concentration carrier regions 11 and 12 in the surface portion of the active layer 7 on the light shielding film 3 side. Thereafter, the same steps as those in the first embodiment are performed to fabricate the TFT substrate 32 having the same sectional structure as that shown in FIG. 2 (FIG. 3(*g*)).

Figure 16:
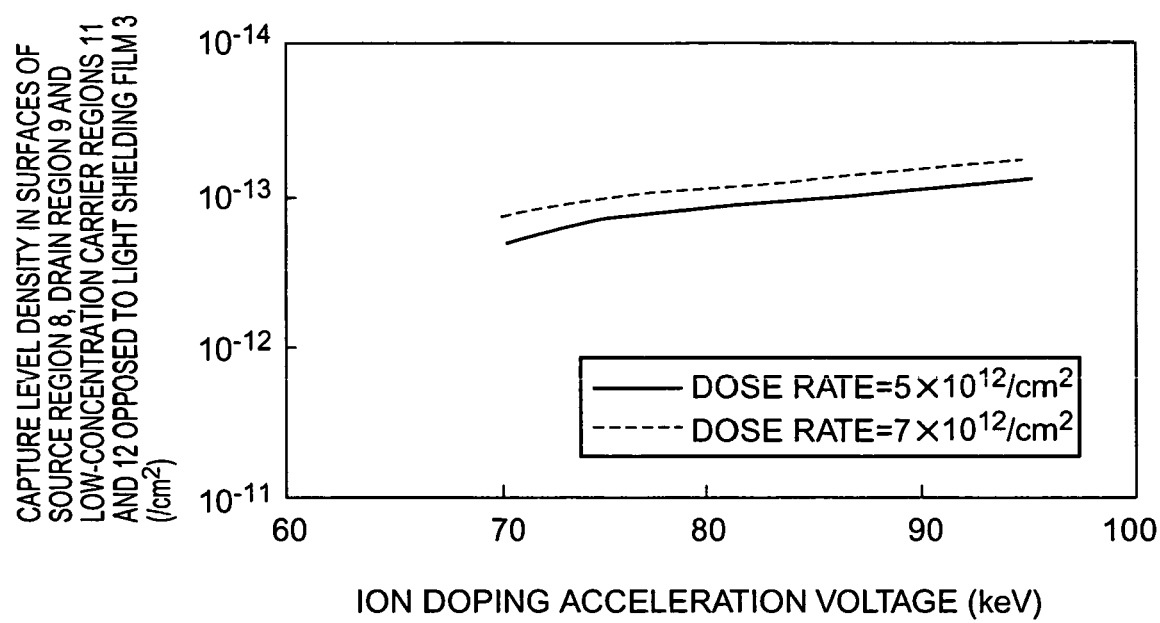
FIG. 16 is a graph showing the relationship between the acceleration voltage at the time of ion doping and the trap level density introduced into the surface of the active layer 7 on the light shielding film 3 side.

FIG. 16 shows the relationship between the acceleration voltage at the time of carrier implantation at the time of formation of the low-concentration carrier regions 11 and 12 and the trap level density introduced into regions in the source region 8, the drain region 9 and the low-concentration carrier regions 11 and 12 in the surface portion of the active layer 7 on the light shielding film 3 side. The introduced trap level density depends on the acceleration voltage and the dose rate at the time of carrier implantation. As shown in FIG. 16, in a case where the dose rate is set to $5 \times 10^{12}/\text{cm}^2$ for example, the acceleration voltage at the time of carrier implantation may be set to at least about 70 keV to set the trap level density introduced into regions in the source region 8, the drain region 9 and the low-concentration carrier regions 11 and 12 in the surface portion of the active layer 7 on the light shielding film 3 side at least about $5 \times 10^{12}/\text{cm}^2$.

Figure 17A:
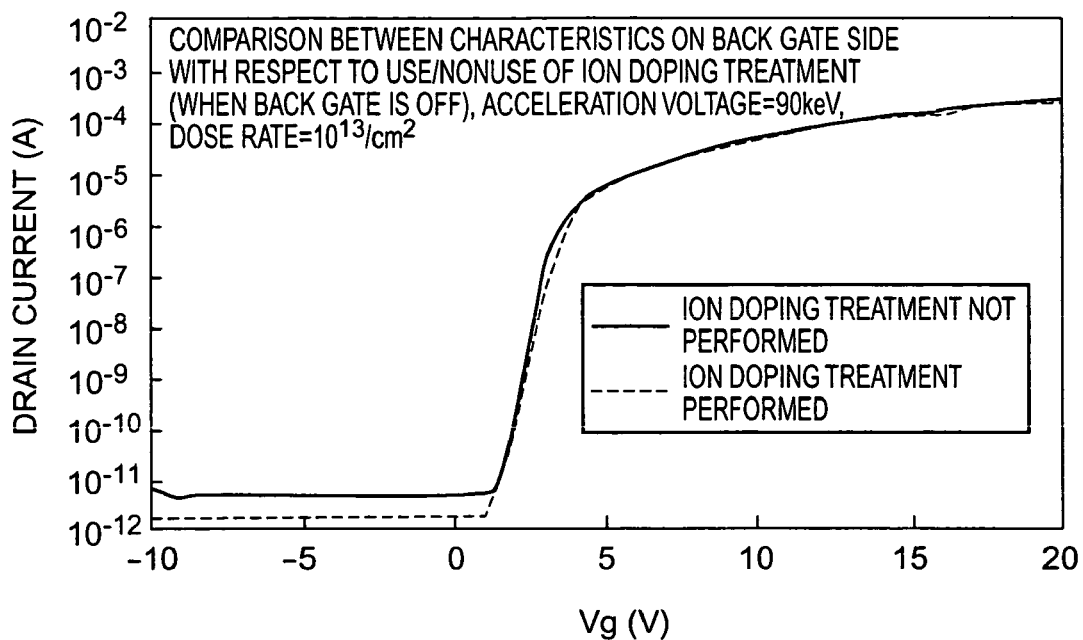
FIG. 17(a) is a graph showing the relationship between the potential applied to the gate electrode 13 and the drain current.
Figure 17B:
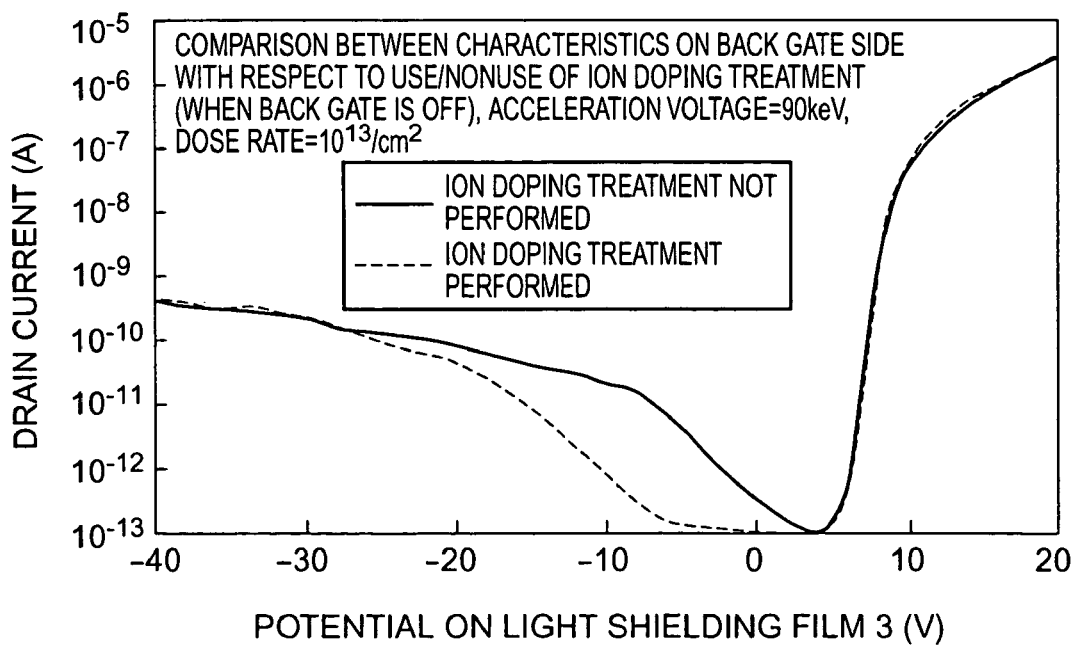
FIG. 17(b) is a graph showing the relationship between the potential applied to the light shielding film 3 and the drain current.

FIG. 17(*a*) shows in a graph the relationship between the potential applied to the gate electrode 13 and the drain current, and FIG. 17(*b*) shows in a graph the relationship between the potential applied to the light shielding film 3 and the drain current. Each of the graphs shown in FIGS. 17(*a*) and 17(*b*) shows a drain current characteristic of the TFT before the introduction of a trap level into regions in the source region 8, the drain region 9 and the low-concentration carrier regions 11 and 12 in the surface portion of the active layer 7 on the light shielding film 3 side, and a drain current characteristic of the TFT after the introduction of the trap level. At the time of introduction of the trap level into the surface of the active layer 7 on the light shielding film 3 side, carrier implantation under conditions: an acceleration voltage of 90 keV and a dose rate of $10^{13}/\text{cm}^2$ was used in carrier implantation at the time of formation of the low-concentration carrier regions 11 and 12.

Referring to FIG. 17(*a*), the drain current was measured in the same manner as in the case shown in FIG. 7(*a*), that is, the voltage applied to the light shielding film 3 was set to a constant value (−2 V), the potential applied to the gate electrode 13 was changed and the drain current was measured. In the TFT 33 having the trap level introduced into the surface of the active layer 7 on the light shielding film 3 side, substantially no reduction in drain current when the TFT was on was observed while the drain current when the TFT was off was smaller than it was before the introduction of the trap level, as shown in FIG. 17(*a*). Also when the drain current was measured by setting the potential applied to the gate electrode 13 to a constant value (−2 V) and by changing the potential applied to the light shielding film 3 as in the case shown in FIG. 7(*b*), substantially no reduction in drain current when the TFT was on was observed, as shown in FIG. 17(*b*), while the leak current when the TFT was off was smaller than it was before the introduction of the trap level.

In this embodiment, a trap level is introduced at a density at least about $5 \times 10^{12}/\text{cm}^2$ into regions in the source region 8, the drain region 9 and the low-concentration carrier regions 11 and 12 in the surface of the active layer 7 on the light shielding film 3 side by adjusting the dose rate and the acceleration voltage in carrier implantation at the time of formation of the low-concentration carrier regions 11 and 12 without adding any new process step for introduction of the trap level. Also in the case of forming the TFT 33 as in this embodiment, the TFT 33 capable of being designed to reduce the leak current when the TFT is off while limiting the reduction in drain current when the TFT is on can be obtained without adding any complicated process step and without reducing the throughput, as in the case of the first to third embodiments. Also, in TFT both a deterioration in TFT characteristic due to a light leak current and a deterioration in TFT characteristic due to the electrical influence of the light shielding film 3 when the light shielding effect of the light shielding film 3 is improved can be simultaneously limited. In a liquid crystal display device using the TFT substrate 32 fabricated in accordance with this embodiment, therefore, good display quality can be maintained even when the luminance of backlight emitted from a light source is increased.

Fifth Embodiment

A TFT substrate in a fifth embodiment of the present invention has the same planar structure as that of the TFT substrate 32 shown in FIG. 1 and the same sectional structure as that of the TFT substrate 32 shown in FIG. 2. In this embodiment, the gate electrode 13 and the light shielding film 3 are electrically connected and the potential on the light shielding film 3 is the same as the potential input to the gate electrode 13. To introduce a trap level into regions in the source region 8, the drain region 9 and the low-concentration carrier regions 11 and 12 in the surface portion of the active layer 7 on the light shielding film 3 side in the TFT substrate 32 of this embodiment, the method of applying electrical stress by applying predetermined potentials to the electrodes after the formation of the TFT substrate 32 as in the first embodiment, the method of performing a hydrogen plasma treatment on the insulating film 4 as in the second embodiment or the method of performing ion doping on the insulating film 4 as in the third embodiment may be adopted. Alternatively, the method of adjusting the dose rate and the acceleration voltage at the time of formation of the low-concentration carrier regions 11 and 12 as in the fourth embodiment may be adopted.

Figure 18A:
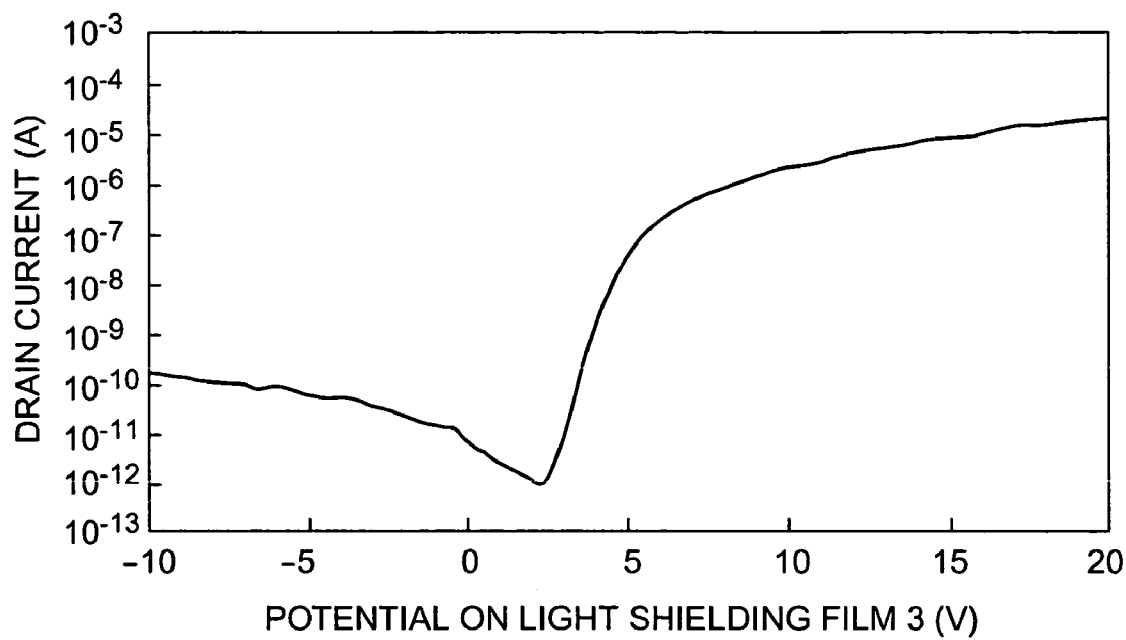
FIG. 18(a) is a graph showing the relationship between the potential on the light shielding film 3 and the drain current in a conventional TFT in which the gate electrode 13 and the light shielding film 3 are connected to each other.
Figure 18B:
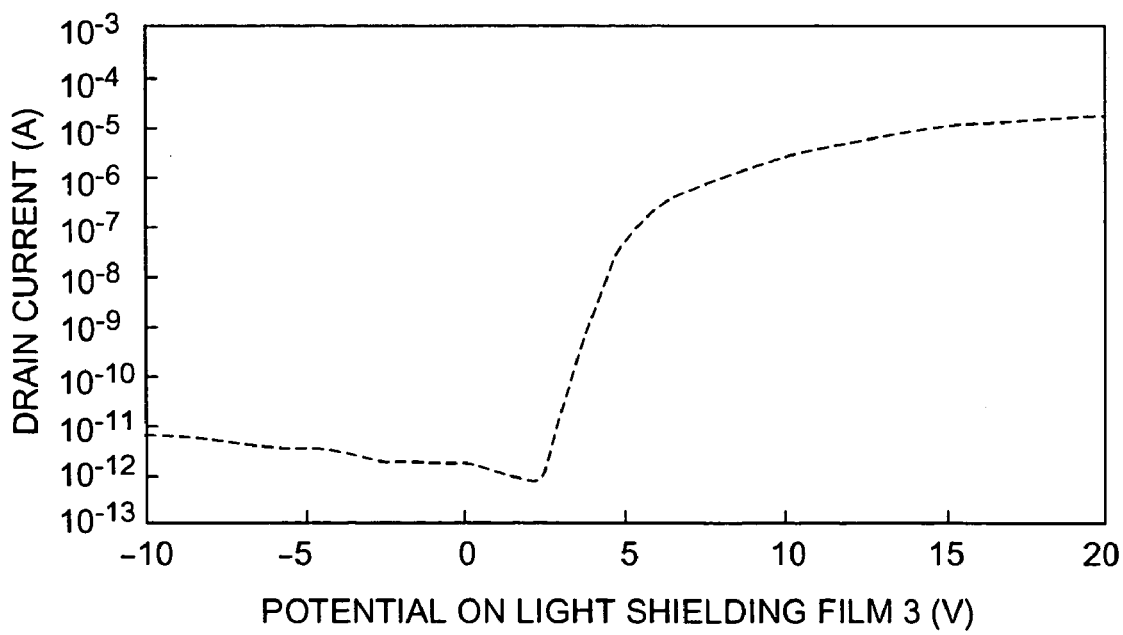
FIG. 18(b) is a graph showing the relationship between the light shielding film 3 and the drain current in TFT 33 in which the gate electrode 13 and the light shielding film 3 are connected to each other, and in which a trap level is introduced into the surface of the active layer 7 on the light shielding film 3 side.

FIG. 18(*a*) shows the relationship between the potential on the light shielding film 3 and the drain current in a conventional TFT in which the gate electrode 13 and the light shielding film 3 are connected to each other, and FIG. 18(*b*) shows the relationship between the light shielding film 3 and the drain current in the TFT 33 in which the gate electrode 13 and the light shielding film 3 are connected to each other, and in which a trap level is introduced into regions in the source region 8, the drain region 9 and the low-concentration carrier regions 11 and 12 in the surface portion of the active layer 7 on the light shielding film 3 side.

With respect to the conventional TFT 33 in which the gate electrode 13 and the light shielding film 3 are connected to each other, it is thought that when, for example, a potential corresponding to the off state of the TFT is applied to the gate electrode 13, the potential corresponding to the off state of the TFT is also applied to the light shielding film 3, and the potentials at the electrodes on the opposite sides in the Y-direction of the active layer 7 become equal to the potential corresponding to the off state of the TFT, and that for this reason a leak current in the TFT 33 can be limited to a small value. The light shielding film 3, however, overlaps not only the channel region 27 but also the source region 8, the drain region 9 and the low-concentration carrier regions 11 and 12. Therefore, when the potentials on the gate electrode 13 and the light shielding film 3 are in such a potential range that the TFT is off, this TFT exhibits the same characteristic as that of the TFT having a self-alignment structure, as shown in FIG. 18(*a*) and, in actuality, the leak current when the TFT is off cannot be reduced.

In the TFT 33 in which a trap level is introduced into regions in the source region 8, the drain region 9 and the low-concentration carrier regions 11 and 12 in the surface portion of the active layer 7 on the light shielding film 3 side, the electric field applied to the source region 8, the drain region 9 and the low-concentration carrier regions 11 and 12 is weakened by the potential on the light shielding film 3. Therefore, when the potentials on the gate electrode 13 and the light shielding film 3 are in such a potential range that the TFT is off, a drain current characteristic such as shown in FIG. 18(*b*) is exhibited and the leak current when the TFT is off is reduced in comparison with the case shown in FIG. 18(*a*).

In a case where a trap level is not excessively introduced into the surface of the channel region 27 in the active layer 7 on the light shielding film 3 side, and where the trap level density introduced into the surface of the channel region 27 on the light shielding film 3 side is higher than the trap level density introduced into the surfaces of the source region 8 and the drain region 9 on the light shielding film 3 side, the degree of weakening of the electric field on the channel region 27 by the potential on the light shielding film 3 is lower than the degree of weakening of the electric field on the source region 8, the drain region 9 and the low-concentration carrier regions 11 and 12. In such TFT 33, therefore, a reduction in leak current when the TFT is off and prevention of a reduction in drain current when the TFT is on can be simultaneously achieved.

Also in the case of electrically connecting the gate electrode 13 and the light shielding film 3 as in this embodiment, the trap level density in the channel region 27 is reduced relative to the trap level density in the source region 8 and the drain region 9 in the surface portion of the active layer 7 on the light shielding film 3 side to ensure that the TFT 33 capable of being designed to reduce the leak current when the TFT is off while limiting the reduction in drain current when the TFT is on can be obtained without adding any complicated process step and without reducing the throughput, as in the case of each of the above-described embodiments. Also, both a deterioration in TFT characteristic due to a light leak current and a deterioration in TFT characteristic due to the electrical influence of the light shielding film 3 when the light shielding effect of the light shielding film 3 is improved can be simultaneously limited. In a liquid crystal display device using the TFT substrate 32 fabricated in accordance with this embodiment, therefore, good display quality can be maintained even when the luminance of backlight emitted from a light source is increased.

Sixth Embodiment

Figure 19:
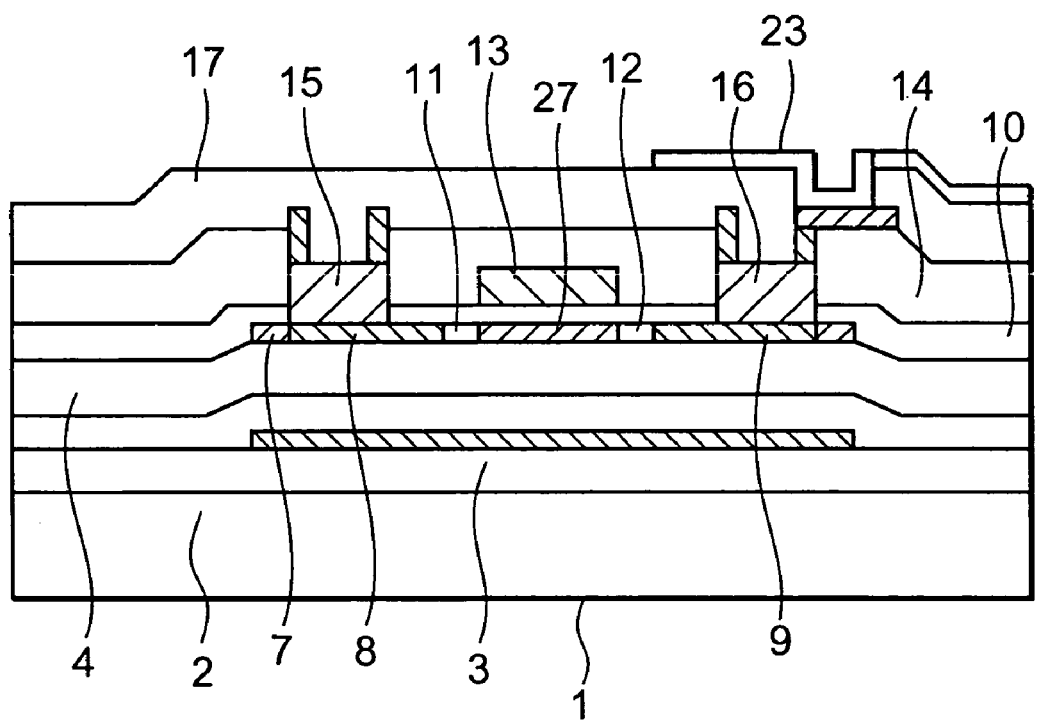
FIG. 19 is a cross-sectional view of a sectional structure of a thin-film transistor array substrate in a sixth embodiment of the present invention.
Figure 19:
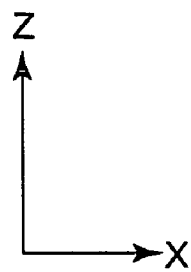

FIG. 19 shows a sectional structure of a TFT substrate 32A of a liquid crystal display device in a sixth embodiment of the present invention. The TFT substrate 32A of this embodiment has the same planar structure as that shown in FIG. 1. The cross-sectional view shown in FIG. 19 corresponds to the cross-sectional view taken along II—II of FIG. 1. A TFT 33A formed on the TFT substrate 32A of this embodiment differs from the TFT 33 in the first to fifth embodiments in that the display element capacitor shown in FIG. 2 is not provided. When a trap level is introduced into the surface of the active layer 7 on the light shielding film 3 side in the TFT substrate 32 of this embodiment, any one of the methods described in the descriptions of the first to fourth embodiments can be used, as in the case of the fifth embodiment.

On the TFT substrate 32A, the gate insulating film 10, the gate electrode 13, the first interlayer insulating film 14, the source electrode 15, the drain electrode 16, the second interlayer insulating film 17 and the display element electrode 23 are formed on the upper layer side of the active layer 7. This TFT substrate 32A is formed to the second interlayer insulating film 17 in the same manner as in FIG. 3(a) to FIG. 3(f). Thereafter, without forming the display element capacitor, the formation on the substrate is completed by forming a contact hole in the second interlayer insulating film 17 and connecting the display element electrode 23 and the drain electrode 16. A trap level is introduced at a density at least about $5 \times 10^{12}/cm^2$ into regions in the source region 8, the drain region 9 and the low-concentration carrier regions 11 and 12 in the surface portion of the active layer 7 on the light shielding film 3 side by one of the methods described in the descriptions of the first to fourth embodiments.

Also in the case where no display element capacitor is formed on the TFT substrate 32A as in this embodiment, the trap level density in the channel region 27 is reduced relative to the trap level density in the source region 8 and the drain region 9 in the surface portion of the active layer 7 on the light shielding film 3 side to ensure that the TFT 33 capable of being designed to reduce the leak current when the TFT is off while limiting the reduction in drain current when the TFT is on can be obtained without adding any complicated process step and without reducing the throughput, as in the case of each of the above-described embodiments. Also, both a deterioration in TFT characteristic due to a light leak current and a deterioration in TFT characteristic due to the electrical influence of the light shielding film 3 when the light shielding effect of the light shielding film 3 is improved can be simultaneously limited. In a liquid crystal display device using the TFT substrate 32 fabricated in accordance with this embodiment, therefore, good display quality can be maintained even when the luminance of backlight emitted from a light source is increased.

Seventh Embodiment

Figure 20:
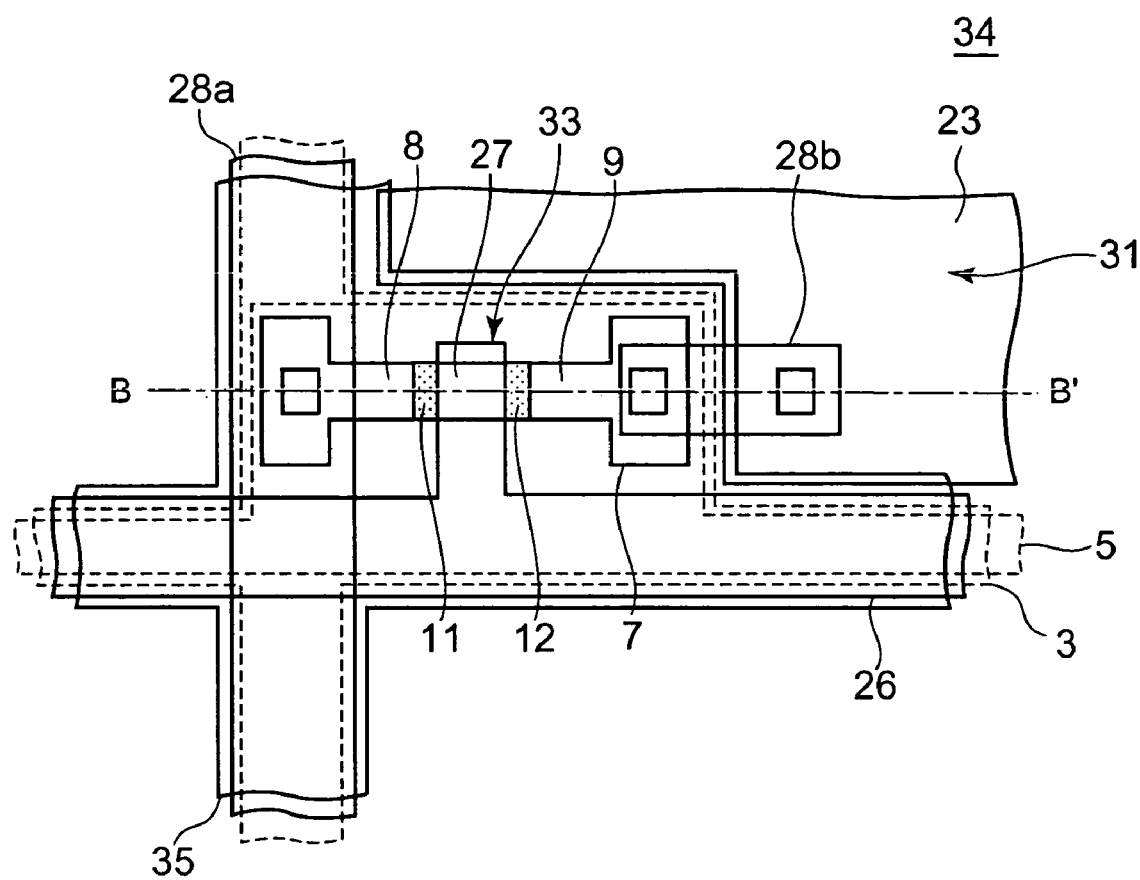
FIG. 20 is a plan view of a portion of a thin-film transistor array substrate about a thin-film transistor in a seventh embodiment of the present invention.
Figure 21:
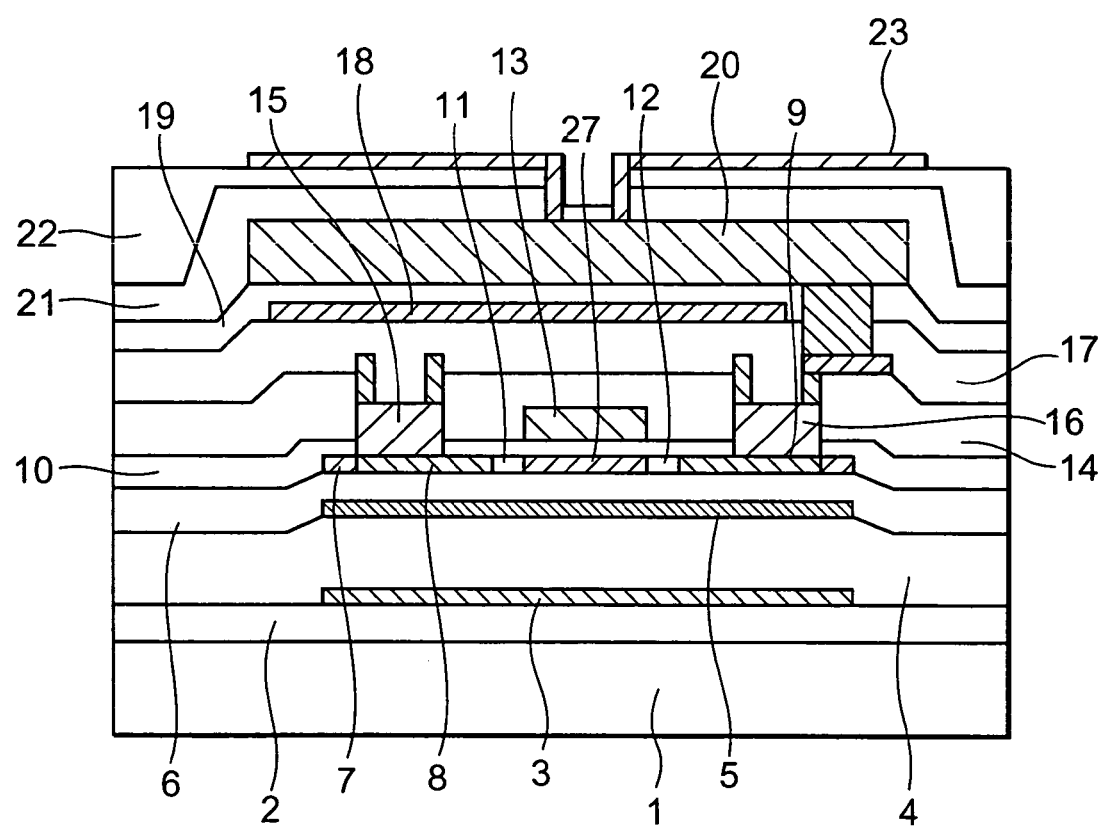
FIG. 21 is a cross-sectional view taken along B–B' of FIG. 20.
Figure 21:
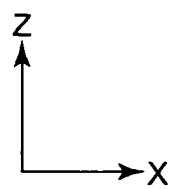

FIG. 20 shows a plan view of a portion of a liquid crystal display device about a thin-film transistor in a seventh embodiment of the present invention, and FIG. 21 is a cross-sectional view taken along B–B' of FIG. 20. A TFT substrate 34 in this embodiment differs from the TFT substrate 32 in the first embodiment in that another light shielding film 5 having a light absorbing property is further formed between the light shielding film 3 and the active layer 7 shown in FIG. 1. As shown in FIG. 21, a second insulating film 6 is formed on the second light shielding film 5, and the active layer 7 is opposed to the second light shielding film 5 with the second insulating film 6 interposed therebetween. In this embodiment, two layers of light shielding film are formed by the first light shielding film 3 having a light reflecting property and the second light shielding film 5 having a light absorbing property. Therefore, the effect of shielding the active layer 7 from light is higher in comparison with that in the case where only one layer of light shielding film having a reflecting property is formed.

The second light shielding film 5 is made of amorphous silicon or the like having an electroconductive property and a light absorbing property and is formed in such a position as to be spatially superposed on the gate line 26 and the TFT 33. The second light shielding film 5 is formed in such a region as to be superposed on the active layer 7 along the X-direction in the lower layer side of the region corresponding to the TFT 33, or in a region slightly larger in area than the active layer 7. The second insulating film 6 is made of silicon oxide is formed to a film thickness of 400 nm or less, preferably 100 to 250 nm on the second light shielding film 5. The second light shielding film 5 is electrically connected to a peripheral circuit not shown, as is the first light shielding film 3. In this embodiment, the trap level density at the interface between the active layer 7 and the second insulating film 6, i.e., in regions in the source region 8, the drain region 9 and the low-concentration carrier regions 11 and 12 in the surface of the active layer 7 opposed to the second light shielding film 5, is set to at least about $5 \times 10^{12}/cm^2$.

Figure 22A:
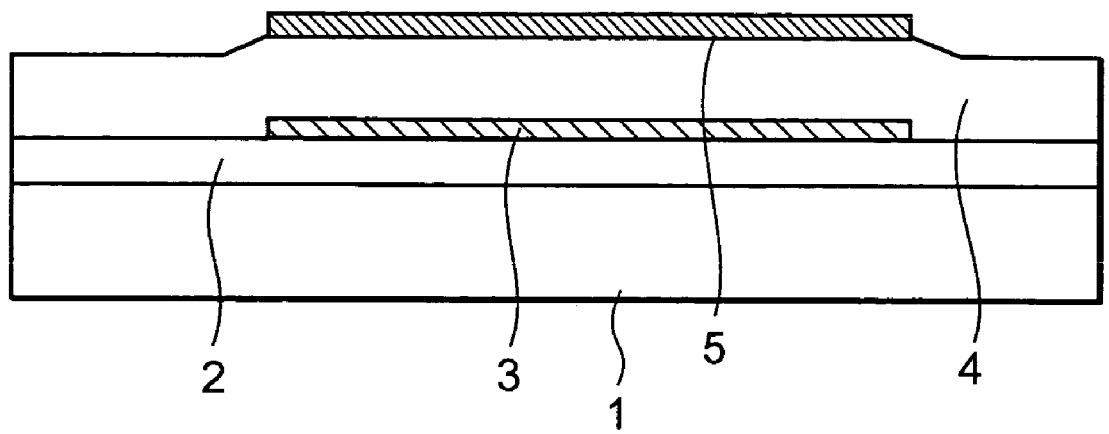
FIGS. 22(a) and 22(b) are cross-sectional views of the TFT substrate 34 in fabrication steps in part of the manufacturing process.
Figure 22B:
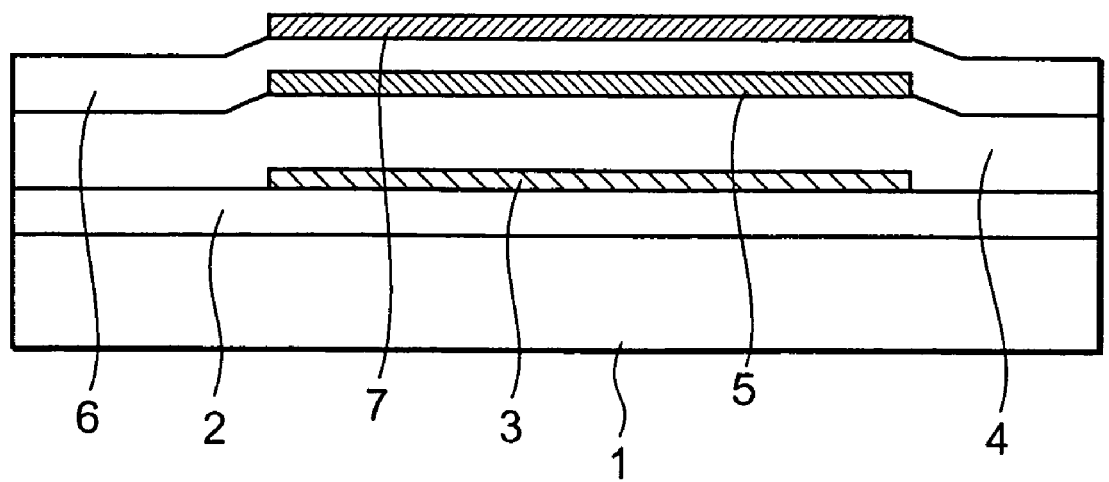

FIGS. 22(a) and 22(b) respectively show the TFT substrate 34 in fabrication steps. The TFT substrate 32 having a sectional structure shown in FIG. 21 is formed as described below. First, in the same steps as those shown in FIGS. 3(a) and 3(b), the base insulating film 2 is formed to a film thickness of about 300 nm on the glass substrate 1; the first light shielding film 3 is formed to a film thickness of 100 to 200 nm on the base insulating film 2; a photoresist is left by a photolithography method on the region where the first light shielding film 3 is formed; and the first light shielding film 3 is selectively removed by a dry etching method, thereby forming the first light shielding film 3 into the desired shape.

Figure 24:
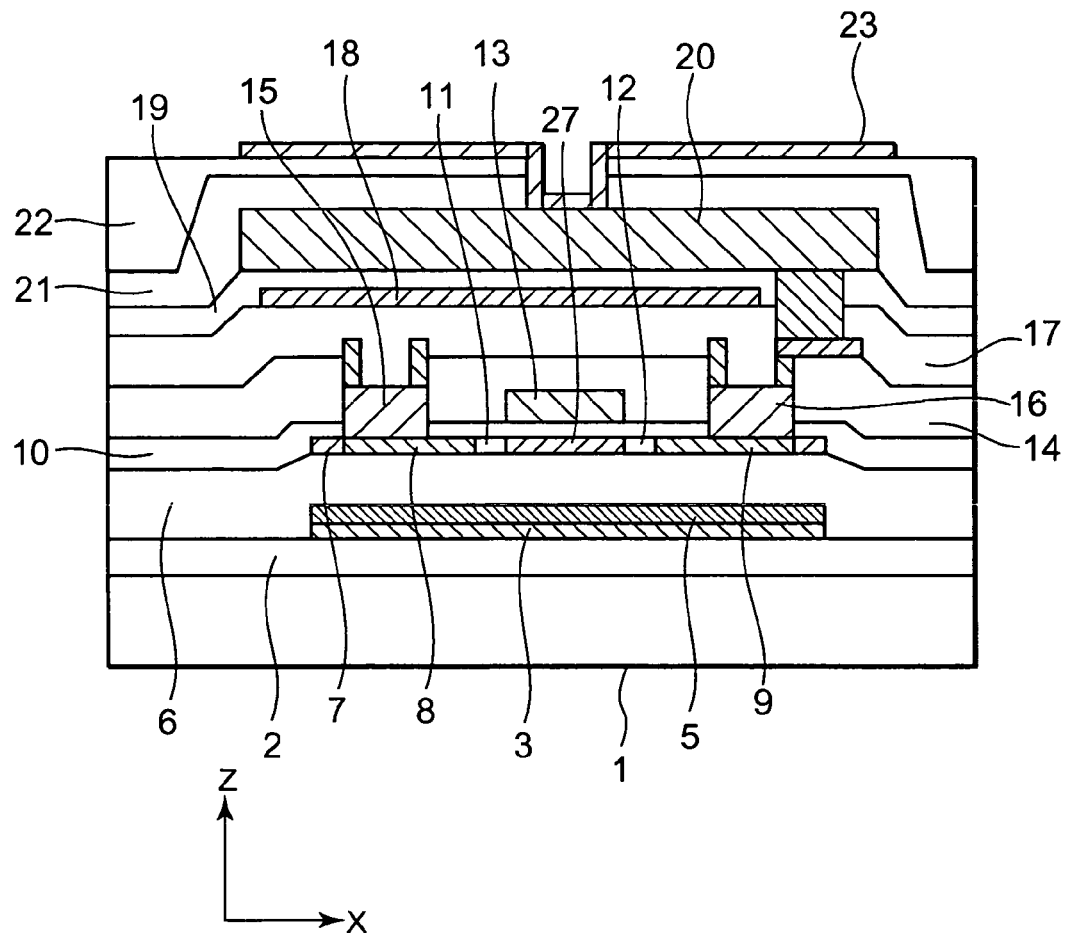
FIG. 24 is a cross-sectional view of a sectional structure of a thin-film transistor array substrate in a ninth embodiment of the present invention.

After the formation of the first light shielding film 3, the insulating film 4 is formed to a film thickness of about 100 to 400 nm on the first light shielding film 3 by a CVD method. The second light shielding film 5 made of amorphous silicon or the like having a light absorbing property is further formed to a film thickness of about 50 to 200 nm on the insulating film 4 by a CVD method. A carrier is implanted in the second light shielding film 5 by using an ion doping method, an ion implantation method or a gaseous phase dose method. A photoresist mask is formed by a photolithography method on the region where the second light shielding film 5 is to be formed, and patterning is performed on the second light shielding film 5 by a dry etching method using this mask (FIG. 24).

On the second light shielding film 5 after patterning, the second insulating film 6 is formed to a film thickness of 400 nm or less by a CVD method. On the second insulating film 6, a silicon film is formed to a thickness of 50 to 150 nm and is annealed by excimer laser to be crystallized. A photoresist mask is formed on the silicon film by a photolithography method and patterning is performed on the silicon film, thereby forming the active layer 7 having the planar shape shown in FIG. 1 (FIG. 24). Thereafter, the source region 8, the drain region 9, the gate insulating film 10, the low-concentration carrier regions 11 and 12, the gate electrode 13, the first interlayer insulating film 14, the source electrode 15, the drain electrode 16, the second interlayer insulating film 17, the lower electrode 18, the capacitor insulating film 19, the upper electrode 20, the third interlayer insulating film 21, the flattening film 22, and the display element electrode 23 are formed in the same manner as in FIG. 3(d) to FIG. 3(g). By the above-described fabrication process, the TFT substrate 34 having a sectional structure shown in FIG. 21 is formed.

To introduce a trap level into regions in the source region 8, the drain region 9 and the low-concentration carrier regions 11 and 12 in the surface portion of the active layer 7 on the second light shielding film 5 side in the TFT substrate 34, the method of applying electrical stress by applying predetermined potentials to the electrodes after the formation of the TFT substrate 34 as in the first embodiment, the method of performing a hydrogen plasma treatment on the second insulating film 6 as in the second embodiment or the method of performing ion doping on the second insulating film 6 as in the third embodiment may be adopted. Alternatively, the method of adjusting the dose rate and the acceleration voltage at the time of formation of the low-concentration carrier regions 11 and 12 as in the fourth embodiment may be adopted.

In this embodiment, two layers of light shielding film are formed and a trap level is introduced at a density at least about $5 \times 10^{12}/cm^2$ into regions of the source region 8 and the drain region 9 in the surface of the active layer 7 in the second light shielding film 5 side, thereby reducing the electrical influence of the second light shielding film 5 on the active layer 7. Therefore, even when the distance between the active layer 7 and the second light shielding film 5 is reduced to reduce the light leak current, deterioration in characteristic of the TFT such as an off-leak current due to the electrical influence of the second light shielding film 5 can be limited. To introduce a trap level into the surface of the active layer 7 on the second light shielding film 5 side, any one of the methods in the first to fourth embodiments can be adopted. The TFT substrate 34 can be fabricated without adding any complicated process step and without reducing the throughput.

Also, in this embodiment, the trap level density in the channel region 27 is reduced relative to the trap level density in the source region 8 and the drain region 9 in the surface portion of the active layer 7 on the second light shielding film 5 side. Therefore, the leak current when the TFT is off can be reduced and the reduction in the drain current when the TFT is on can be limited, as described above. In the liquid crystal display device using the TFT substrate 34, therefore, a high luminance and high contrast can be achieved even when the luminance of backlight emitted from a light source is increased.

Eighth Embodiment

Figure 23:
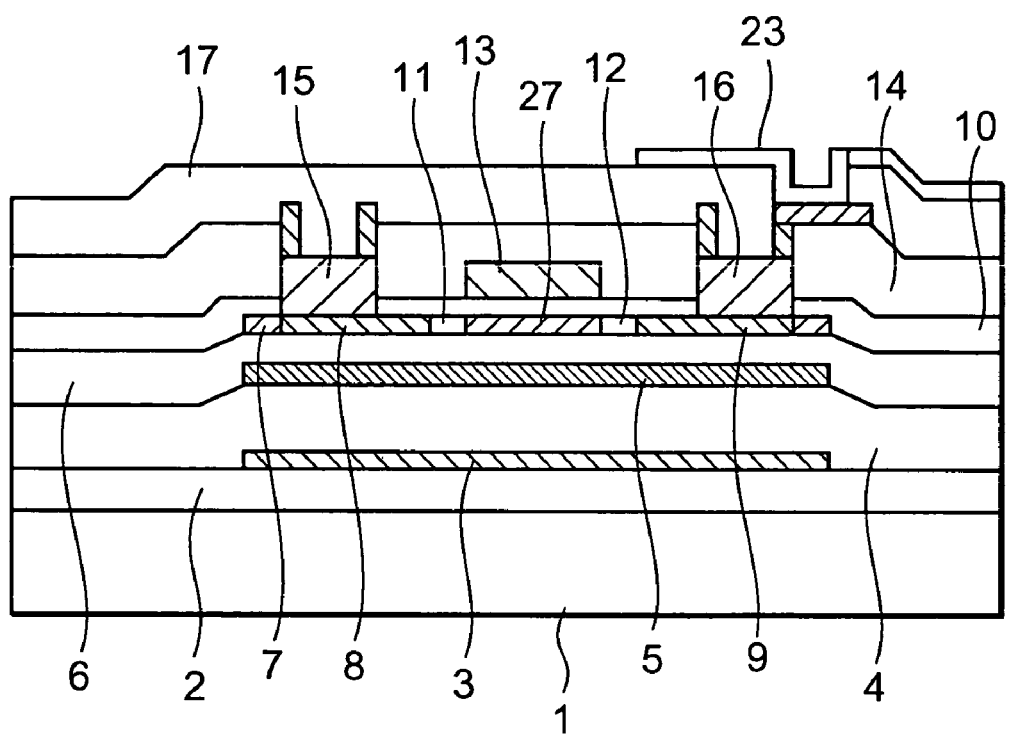
FIG. 23 is a cross-sectional view of a sectional structure of a thin-film transistor array substrate in an eighth embodiment of the present invention.

FIG. 23 shows a sectional structure of a TFT substrate of a liquid crystal display device in an eighth embodiment of the present invention. The TFT substrate 34A of this embodiment has the same planar structure as that shown in FIG. 20. The cross-sectional view shown in FIG. 23 corresponds to the cross-sectional view taken along B–B' of FIG. 20. A TFT 33A formed on the TFT substrate 34A of this embodiment differs from the TFT 33 in the seventh embodiment in that the display element capacitor shown in FIG. 21 is not provided. When a trap level is introduced into regions in the source region 8, the drain region 9 and the low-concentration carrier regions 11 and 12 in the surface portion of the active layer 7 on the second light shielding film 5 side in the TFT substrate 32 of this embodiment, any one of the methods described in the descriptions of the first to fourth embodiments can be used, as in the case of the seventh embodiment.

On the TFT substrate 34A, the gate insulating film 10, the gate electrode 13, the first interlayer insulating film 14, the source electrode 15, the drain electrode 16, the second interlayer insulating film 17 and the display element electrode 23 are formed on the upper layer side of the active layer 7. This TFT substrate 34A is formed to the second interlayer insulating film 17 in the same manner as the TFT substrate 34 in the seventh embodiment. Thereafter, without forming the display element capacitor, the formation on the substrate is completed by forming a contact hole in the second interlayer insulating film 17 and connecting the display element electrode 23 and the drain electrode 16. A trap level is introduced at a density at least about $5 \times 10^{12}/cm^2$ into regions in the source region 8, the drain region 9 and the low-concentration carrier regions 11 and 12 in the surface portion of the active layer 7 on the second light shielding film 5 side by one of the methods described in the descriptions of the first to fourth embodiments.

Also in the case where no display element capacitor is formed on the TFT substrate 34A as in this embodiment, the trap level density in the channel region 27 is reduced relative to the trap level density in the source region 8 and the drain region 9 in the surface portion of the active layer 7 on the second light shielding film 5 side to ensure that the TFT capable of being designed to reduce the leak current when the TFT is off while limiting the reduction in drain current when the TFT is on can be obtained without adding any complicated process step and without reducing the throughput, as in the case of the above-described seventh embodiment. Also, both a deterioration in TFT characteristic due to a light leak current and a deterioration in TFT characteristic due to the electrical influence of the second light shielding film 5 when the light shielding effect of the light shielding film is improved can be simultaneously limited. In the liquid crystal display device using the TFT substrate 34A of this embodiment, therefore, good display quality can be maintained even when the luminance of backlight emitted from a light source is increased.

Ninth Embodiment

FIG. 24 shows a sectional structure of a TFT substrate of a liquid crystal display device in a ninth embodiment of the present invention. The TFT substrate 34B of this embodiment has the same planar structure as that shown in FIG. 20. The cross-sectional view shown in FIG. 24 corresponds to the cross-sectional view taken along B–B' of FIG. 20. This embodiment differs from the seventh embodiment in that the first light shielding film 3 and the second light shielding film 5 shown in FIG. 19 are stacked with no insulating film 4 interposed therebetween. In this embodiment, the second light shielding film 5 may be non-electroconductive. When a trap level is introduced into the surface of the active layer 7 on the second light shielding film 5 side in the TFT substrate 34B of this embodiment, any one of the methods described in the descriptions of the first to fourth embodiments can be used, as in the case of the seventh embodiment.

Figure 25A:
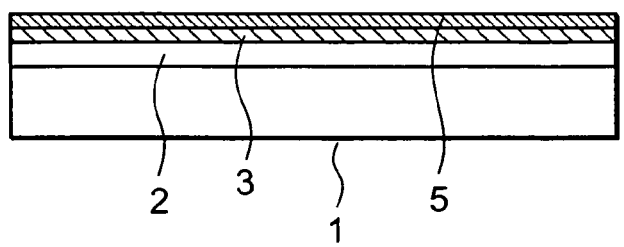
FIGS. 25(a) and 25(b) are cross-sectional views of the TFT substrate 34B in fabrication steps in part of the manufacturing process.
Figure 25B:
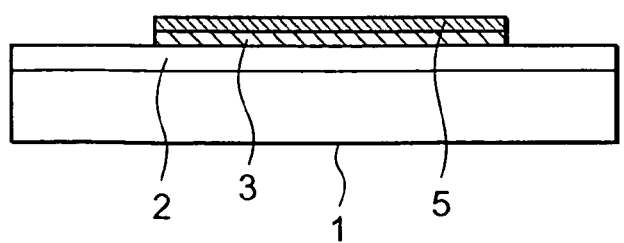

FIGS. 25(*a*) and 25(*b*) show part of the process of fabricating the TFT substrate 34B. First, in the same manner as in FIG. 3(*a*), the base insulating film 2 is formed to a thickness of about 300 nm on the entire surface of the glass substrate 1, and the first light shielding film 3 is formed to a film thickness of about 100 to 200 nm on the base insulating film 2 by a sputtering method. As a layer stacked on the first light shielding film 3, the second light shielding film 5 is formed to a film thickness of about 50 to 200 nm by a CVD method (FIG. 25(*a*)). A photoresist is left by a photolithography method on the region where the first light shielding film 3 and the second light shielding film 5 are formed, and the first light shielding film 3 and the second light shielding film 5 are selectively removed by a dry etching method, thereby forming the first light shielding film 3 and the second light shielding film 5 into the desired shape (FIG. 25(*b*)). The insulating film 6 is formed on the second light shielding film 5 and the same steps as those in the seventh embodiment are performed to fabricate the TFT substrate 34B having a sectional structure shown in FIG. 24.

Also in the case where the first light shielding film 3 and the second light shielding film 5 are stacked without interposing the first insulating film 4 shown in FIG. 24 as in this embodiment, the trap level density in the channel region 27 is reduced relative to the trap level density in the source region 8 and the drain region 9 in the surface portion of the active layer 7 on the second light shielding film 5 side to ensure that the TFT capable of being designed to reduce the leak current when the TFT is off while limiting the reduction in drain current when the TFT is on can be obtained without adding any complicated process step and without reducing the throughput, as in the case of the above-described seventh embodiment. Also, both a deterioration in TFT characteristic due to a light leak current and a deterioration in TFT characteristic due to the electrical influence of the second light shielding film 5 when the light shielding effect of the light shielding film is improved can be simultaneously limited. In the liquid crystal display device using the TFT substrate 34B of this embodiment, therefore, good display quality can be maintained even when the luminance of backlight emitted from a light source is increased.

In this embodiment, the first light shielding film 3 and the second light shielding film 5 are directly stacked one on another. Therefore, the step of forming the first insulating film 4 can be removed and the manufacturing process can be simplified in comparison with the seventh embodiment. Also, since the first light shielding film 3 and the second light shielding film 5 are directly stacked one on another, the potential on the first light shielding film 3 and the potential on the second light shielding film 5 are equal to each other and only the first light shielding film 3 may be electrically connected to a peripheral circuit not shown. Therefore, the second light shielding film 5 may be non-electroconductive, and the step of implanting a carrier in the second light shielding film 5, necessary in the seventh embodiment, may be removed to further simplify the manufacturing process. In this manner, the manufacturing time can be reduced to further improve the throughput in manufacture of a liquid crystal display device.

Tenth Embodiment

Figure 26:
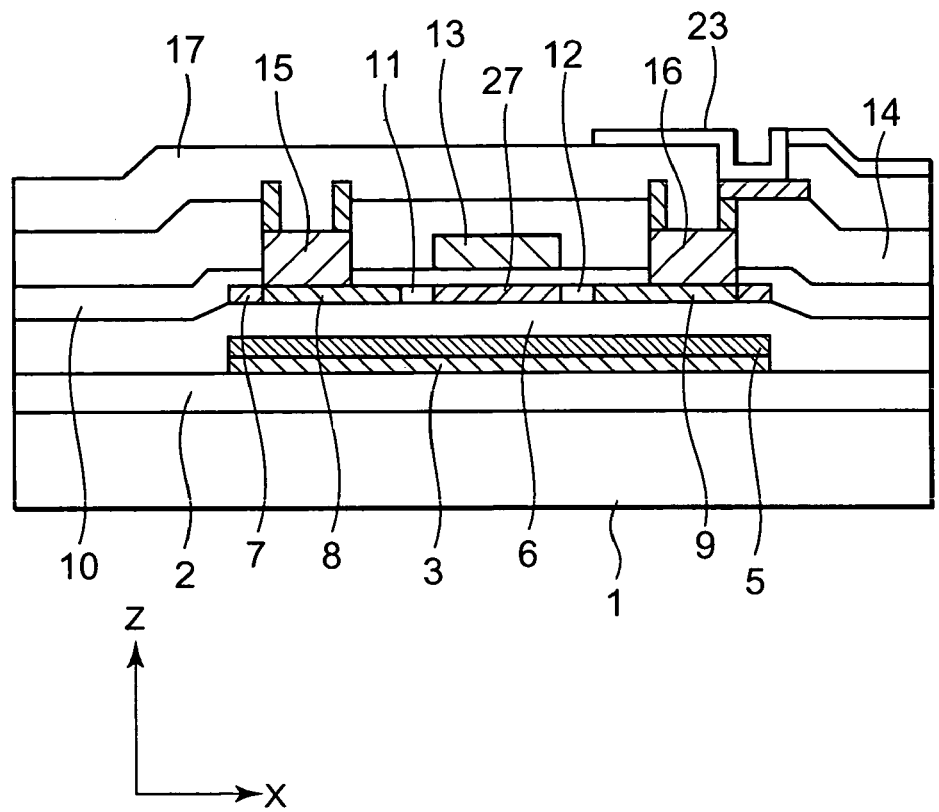
FIG. 26 is a cross-sectional view of a sectional structure of a thin-film transistor array substrate in a tenth embodiment of the present invention.

FIG. 26 shows a sectional structure of a TFT substrate of a liquid crystal display device in a tenth embodiment of the present invention. The TFT substrate 34C of this embodiment has the same planar structure as that shown in FIG. 20. The cross-sectional view shown in FIG. 26 corresponds to the cross-sectional view taken along B–B' of FIG. 20. This embodiment differs from the ninth embodiment in that the display element capacitor shown in FIG. 23 is not provided. When a trap level is introduced into the surface of the active layer 7 on the second light shielding film 5 side in the TFT substrate 34C of this embodiment, any one of the methods described in the descriptions of the first to fourth embodiments can be used, as in the case of the seventh embodiment.

Also in the case where no display element capacitor is formed on the TFT substrate 34C as in this embodiment, the trap level density in the channel region 27 is reduced relative to the trap level density in the source region 8 and the drain region 9 in the surface portion of the active layer 7 on the second light shielding film 5 side to ensure that the TFT 33 capable of being designed to reduce the leak current when the TFT is off while limiting the reduction in drain current when the TFT is on can be obtained without adding any complicated process step and without reducing the throughput, as in the case of the above-described ninth embodiment. Also, both a deterioration in TFT characteristic due to a light leak current and a deterioration in TFT characteristic due to the electrical influence of the light shielding film 3 when the light shielding effect of the light shielding film 3 is improved can be simultaneously limited. In a liquid crystal display device using the TFT substrate 34C of this embodiment, therefore, good display quality can be maintained even when the luminance of backlight emitted from a light source is increased.

Figure 27:
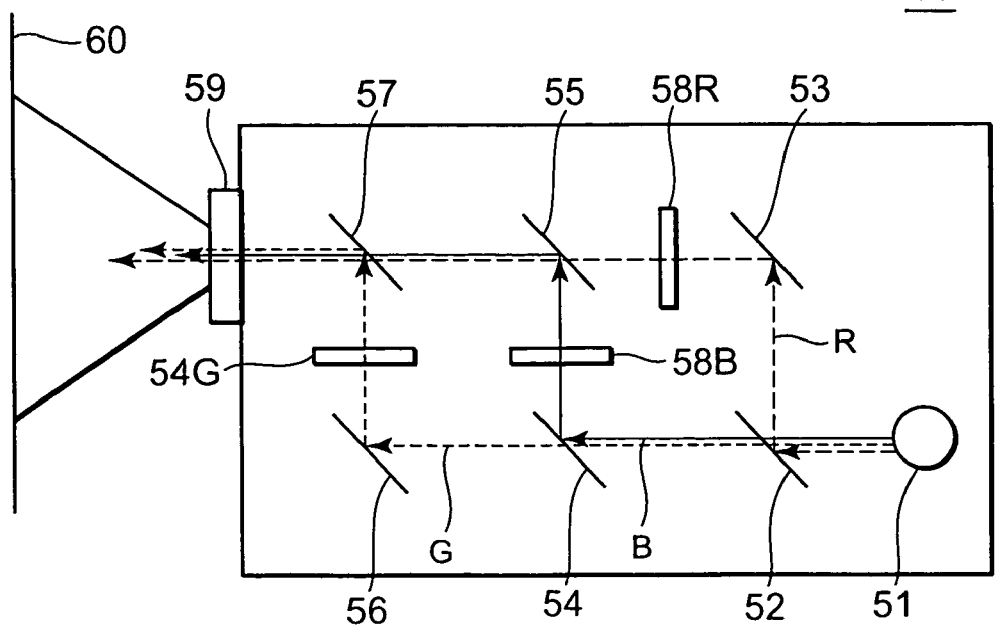
FIG. 27 is a block diagram showing an example of a configuration of a conventional projector.

FIG. 27 shows an example of a configuration of a projection-type liquid crystal display device (projector) having the TFT substrate of the present invention. This projector 50 is constituted by a halogen lamp 51, dichroic lenses 52 to 57, light valves 58R, 58G, and 58B, and a projection lens 59. Each light valve 58 has one of the TFT substrates of the first to tenth embodiments, a liquid crystal layer and a counter substrate (not shown). Light having R (red), G (green) and B (blue) components emitted from the halogen lamp 51 which is a light source is separated into the components by the dichroic lenses 52 to 57. The amounts of transmission of the separated R, G and B components of light are controlled by the light valves 58R, 58G, and 58B disposed in correspondence with the components of light. The components of light then travel to the projection lens 59. The projection lens 59 projects light formed by combining the components to display an image on a screen 60.

Figure 28:
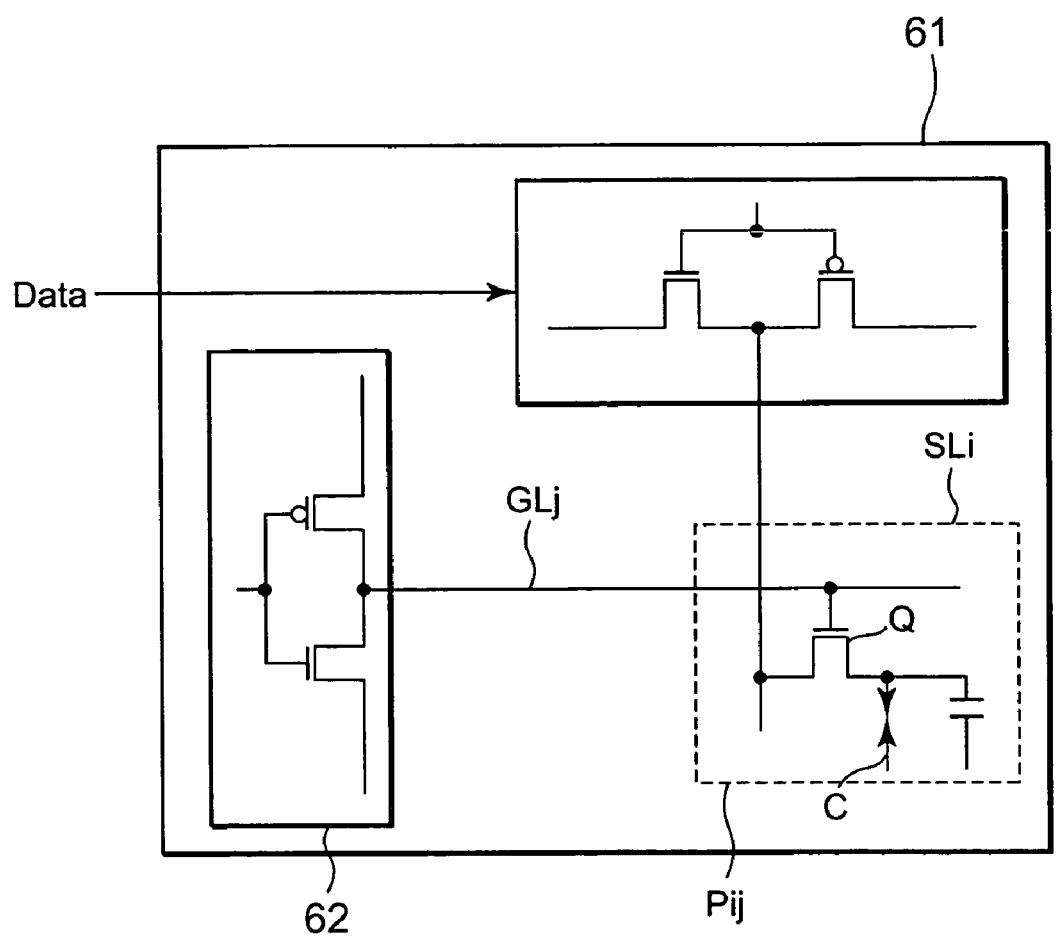
FIG. 28 is an equivalent circuit diagram of a portion of the light valve 58.

FIG. 28 shows an equivalent circuit diagram of part of the light valves 58. Each light valve 58 is an active-matrix display device constituted by a plurality of display elements Pij provided at points of intersection of a plurality of data bus lines DLi corresponding to the data lines 28a shown in FIG. 1 and a plurality of gate bus lines GLj corresponding to the gate lines 26 shown in FIG. 1. Each display element Pij is constituted by a transistor Q formed by the TFT formed on one of the TFT substrates in the first to tenth embodiments and a liquid crystal cell C.

Each data bus line DLi is driven by a data driver 61 to which data for determining the amount of transmission of light through each display element Pij is input. Each gate bus line GLj is driven by a gate driver 62. The liquid crystal cell C of the display element Pij controls the amount of light passing therethrough from the halogen lamp 51 side to the projection lens 59 side on the basis of a signal supplied from the data driver 61 through the transistor Q of the display element Pij. Each of the TFT substrates in the above-described embodiments is capable of limiting deterioration in TFT characteristic due to the electrical influence of the light shielding film while reducing a light leak by improving the light shielding effect based on the light shielding film, and can therefore be used suitably as the light valve 58 of the projector 50.

An example of use of a metal film or a metal silicide film as light shielding film 3 having non-light-transmitting and electroconductive properties in each of the embodiments has been described. However, the light shielding film 3 may be formed of a material other than metals or high-melting. point metals if the film has electroconductive and non-light-transmitting properties. For example, tungsten (W), tantalum (Ta), titanium (Ti), chromium (Cr), molybdenum (Mo) or the like can be used as the light shielding film 3. The second light shielding film 5 having light-absorbing and electroconductive properties is not limited to amorphous silicon. The second light shielding film 5 may be formed as a semiconductor thin film such as a film of microcrystalline silicon (µc-Si), amorphous Si-xGex; polygermanium (Poly-Ge), amorphous germanium (a-Ge), or poly-Si-xGex. In the first to sixth embodiments, the light shielding film 3 may be replaced with the second light shielding film 5 having light-absorbing and electroconductive properties. The thin-film transistor may have a light shielding film other than the first light shielding film 3 and the second light shielding film 5, or have a light shielding film in addition to the first light shielding film 3 and the second light shielding film 5.

The film thicknesses of the layers described with respect to each of the embodiments, e.g., the insulating film formed on the glass substrate, the light shielding film, the active layer of the thin-film transistor and the gate insulating film are only examples. The film thickness may be changed as desired according to a purpose, use, etc. The gate electrode 13 is not limited to the metal film or the metal silicide film. The gate electrode 13 may be formed by using tungsten (W), tantalum (Ta), titanium (Ti), chromium (Cr), molybdenum (Mo), aluminum (Al) or the like. For forming the second light shielding film 5, a sputtering method, a plasma CVD method or the like may be used as desired instead of the CVD method. In carrier implantation in the second light shielding film 5, the second light shielding film 5 may be obtained as a light shielding film of a low carrier concentration in such a manner that in a semiconductor film having a carrier of one conduction type, a carrier of a conduction type opposite to that of the carrier in the semiconductor film is implanted. An example of forming the low-concentration carrier region 11 between the source region 8 and the channel region 27 and the low-concentration carrier region 12 between the drain region 9 and the channel region 27 has been described with respect to each embodiment. It is not always necessary to form the low-concentration carrier regions 11 and 12.

The above-described methods of introducing a trap level into the surface of the active layer 7 on the light shielding film surface are not exclusively used. Other methods or a suitable combination of the above-described methods may be used. For example, introduction of a trap level by carrier implantation at the time of formation of the low-concentration carrier regions 11 and 12 described above with respect to the fourth embodiment and the trap level introduction method described with respect to the first to third embodiments may be used in combination. In any of the second to tenth embodiments, as described in the first embodiment, any process step in which the temperature exceeds 600° C. is not included in the manufacturing process after the introduction of a trap level and no compensation is made for the introduced trap level even after the TFT substrate is incorporated into the liquid crystal display device.

In the first embodiment, the potentials applied to the electrodes at the time of application of electrical stress to the active layer 7 are not limited to the above-described combination. For example, electrical stress may be applied to the active layer 7 in such a manner that ground potential is applied to the source electrode 15 and the drain electrode 16, a potential of 20 to 80 V is applied to the light shielding film 3, and this state is maintained for one to ten minutes to cause a current to flow at the desired current density in the insulating film 4. In such a case, from the viewpoint of throughout in manufacture of the TFT, the electrical withstand voltage of the TFT and variation in characteristics, it is preferable to apply electrical stress to the active layer 7 by applying ground potential to the source electrode 15 and the drain electrode 16, applying a potential of −40 to −80 V to the light shielding film 3 and maintaining this state for 3 to 8 minutes. The conditions for this application may alternatively be such that ground potential is applied to the source electrode 15 or the drain electrode 16 and a potential of 40 to 80 V is applied to the light shielding film 3.

The present invention has been described on the basis of preferred embodiments thereof. However, the thin-film transistor, the TFT substrate, the liquid crystal display device and the method of manufacturing the thin-film transistor are not limited to those in the above-described embodiments. Those obtained by making various modifications and changes in the configurations of the above-described embodiments are also included in the scope of the present invention.

What is claimed is:

1. A thin-film transistor comprising:
   an electroconductive film;
   a first insulating film located on the electroconductive film;
   an active layer located on the first insulating film,
   the active layer having a source region, a drain region, and a channel region intermediate the source region and the drain region,
   the active layer including an interface region adjacent the first insulating film;
   a gate insulating film located on the active layer; and
   a gate electrode located on the gate insulating film, wherein,
   a first trap level density of the source and drain regions in the interface region, is higher than a second trap level density of the channel region in the interface region.

2. The thin-film transistor according to claim 1, wherein said first trap level density is at least about $5 \times 10^{12}/cm^2$.

3. The thin-film transistor according to claim 1, wherein, said electroconductive film comprises a light-absorbing film and a light-reflecting film, and
   said light-absorbing film faces said active layer.

4. The thin-film transistor according to claim 3, wherein, a light-reflecting film and a light-absorbing film contact each other.

5. The thin-film transistor according to claim 1, wherein, said source region and said drain region are of a first conduction type,
   said active layer further comprises a first low-concentration carrier region between said source region and said channel region and a second low-concentration carrier region between said drain region and said channel region,
   the first and second low-concentration carrier regions are of the first conduction type, and
   the first and second low-concentration carrier regions have impurity concentrations lower than impurity concentrations in said source region and said drain region.

6. A TFT substrate, comprising:
   an optically transparent substrate;
   a plurality of the thin-film transistors, according to claim 1, with the electroconductive film of each of said transistors formed on the optically transparent substrate; and
   a display element electrode connected to each of said thin-film transistors.

7. A liquid crystal display device, comprising:
   the TFT substrate according to claim 6;
   a counter substrate opposed to said TFT substrate; and
   a liquid crystal layer between said TFT substrate and said counter substrate.

8. A method of manufacturing a thin-film transistor, comprising the sequential steps of:
   successively forming an active layer, a gate insulating film and a gate electrode on at least one layer of an electroconductive film with a first insulating film interposed therebetween; and
   introducing a desired trap level density, into a surface of the active layer, adjacent an interface with the first insulating film, by causing a current, of at least a predetermined value, to flow in the first insulating film between the active layer and the electroconductive film.

9. The method of claim 8, wherein,
the step of introducing a trap level density provides sufficient current to deteriorate the first insulating film and provide crystal defects sufficient to introduce the desired trap level density in a source region and a drain region of the active layer.

10. The method of claim 9, wherein,
the step of introducing a trap level density maintains the current for a period of 1 to 10 minutes,
another trap level density is introduced into a first carrier region, of the active layer, adjacent the source region, and
the another trap level density is introduced into a second carrier region, of the active layer, adjacent the drain region.

11. The method of claim 8, wherein,
the step of introducing a trap level density comprises applying a potential to the electroconductive film to cause the current flowing, in the first insulating film between the active layer and the electroconductive film, to have a current density of at least about 2.5 A/m² in the first insulating film.

12. The method of claim 8, wherein,
the step of introducing a trap level density comprises applying a potential to cause the current flowing, in the first insulating film between the active layer and the electroconductive film, to electrically stress a crystallinity of the first insulating film to cause crystal defects sufficient to provide desired trap level densities in a source region, a drain region, and carrier regions of the active layer.

13. The method of claim 8, wherein,
a first trap level density in a source region of the active layer and a drain region of the active layer is higher than a second trap level density in a channel region of the active layer.

14. A method of manufacturing a thin-film transistor, comprising the steps of:
forming a first insulating film on an upper surface of an electroconductive film;
doping an upper surface of the first insulating film with impurity ions to introduce a trap level density into the upper surface; and
successively forming an active layer, a gate insulating film and a gate electrode on the upper surface of the first insulating film,
wherein the upper surface becomes a surface portion of the active layer facing the electroconductive film.

15. The method of claim 14, wherein a first trap level density in a source region and a drain region is higher than a second trap level density in a channel region in the surface portion of the active layer.

16. A method of manufacturing a thin-film transistor having an active layer, a gate insulating film and a gate electrode successively formed on at least one layer of an electroconductive film with a first insulating film interposed therebetween, comprising the step of:
doping a surface portion of the active layer facing the electroconductive film with impurity ions to introduce a trap level density into the surface portion of the active layer.

17. The method of claim 16, wherein a first trap level density in a source region and a drain region is higher than a second trap level density in a channel region in the surface portion of said active layer.

18. A method of manufacturing a thin-film transistor having an active layer, a gate insulating film and a gate electrode successively formed on at least one layer of an electroconductive film with a first insulating film interposed therebetween, comprising the step of:
performing a plasma treatment on a surface portion of said first insulating film facing said active layer to introduce a trap level density into an interface between said active layer and said first insulating film.

19. The method of manufacturing a thin-film transistor according to claim 18, wherein a first trap level density in a source region and a drain region is higher than a second trap level density in a channel region in the surface portion of said active layer.

* * * * *